US006996148B2

(12) United States Patent
Shchukin et al.

(10) Patent No.: US 6,996,148 B2
(45) Date of Patent: Feb. 7, 2006

(54) SEMICONDUCTOR LASER BASED ON THE EFFECT OF PHOTONIC BAND GAP CRYSTAL-MEDIATED FILTRATION OF HIGHER MODES OF LASER RADIATION AND METHOD OF MAKING SAME

(75) Inventors: Vitaly Shchukin, Berlin (DE); Nikolai Ledentsov, Berlin (DE)

(73) Assignee: PBC Lasers Ltd., (IL)

( * ) Notice: Subject to any disclaimer, the term of this patent is extended or adjusted under 35 U.S.C. 154(b) by 16 days.

(21) Appl. No.: 10/834,298

(22) Filed: Apr. 28, 2004

(65) Prior Publication Data

US 2004/0208215 A1 Oct. 21, 2004

Related U.S. Application Data

(62) Division of application No. 09/946,016, filed on Sep. 4, 2001, now Pat. No. 6,804,280.

(51) Int. Cl.
*H01S 5/00* (2006.01)
(52) U.S. Cl. .............................. 372/45; 372/43; 372/44; 372/50
(58) Field of Classification Search ............. 372/43–50
See application file for complete search history.

(56) References Cited

U.S. PATENT DOCUMENTS

| | | | | |
|---|---|---|---|---|
| 4,328,469 | A | 5/1982 | Scifres et al. ................ 372/45 |
| 5,976,905 | A | 11/1999 | Cockerill et al. ............ 438/36 |
| 6,001,664 | A | 12/1999 | Swirhun et al. ............. 438/31 |
| 6,028,693 | A | 2/2000 | Fork et al. ................... 359/248 |
| 6,160,834 | A | 12/2000 | Scott ........................... 372/96 |
| 6,304,366 | B1 | 10/2001 | Scalora et al. .............. 359/328 |
| 6,343,167 | B1 | 1/2002 | Scalora et al. .............. 385/37 |
| 6,392,256 | B1 | 5/2002 | Scott et al. ................. 257/184 |
| 6,396,617 | B1 | 5/2002 | Scalora ........................ 359/248 |
| 6,396,859 | B1 | 5/2002 | Kopp et al. .................. 372/39 |
| 6,542,682 | B2 | 4/2003 | Cotteverte et al. .......... 385/125 |
| 6,804,280 | B2 * | 10/2004 | Shchukin et al. ............. 372/45 |
| 2004/0076213 | A1 * | 4/2004 | Ledentsov et al. ............ 372/97 |

OTHER PUBLICATIONS

Ledentsov, Nikolai N., "Nanostructures How Nature Does It", Educational Centre at IOFFE Institute Invited Lecture. Oct. 13, 2000. Http://web.edu.ioffe.ru/lectures/index_en.html.

R.D. Mead, et al., Accurate theoretical analysis of photonic band-gap materials, Physical Review B Condensed Matter, vol. 48, No. 11, pp. 8434-8437, Sep. 15, 1993.

(Continued)

*Primary Examiner*—Minsun Oh Harvey
*Assistant Examiner*—Delma R. Flores-Ruiz
(74) *Attorney, Agent, or Firm*—Brown & Michaels, PC

(57) ABSTRACT

A semiconductor laser having a low beam divergence is disclosed. The laser includes at least one waveguide comprising an active layer generating an optical gain by injection of a current, a photonic band gap crystal having the refractive index modulation in the direction perpendicular to the propagation of the emitted light, and at least one defect. The active layer is preferably placed within the defect. The photonic band gap crystal and the defect are optimized such that the fundamental mode of laser radiation is localized at the defect and decays away from the defect, while the other optical modes are extended over the photonic band gap crystal. Localization of the fundamental mode at the defect results in the relative enhancement of the amplitude of the mode with respect to the other modes. Therefore, there is a larger confinement factor of the fundamental mode as compared to the confinement factor of the other modes. This enables efficient single-mode lasing from the laser having an extended waveguide.

40 Claims, 18 Drawing Sheets

OTHER PUBLICATIONS

Dennis G. Deppe, Optical microcavities and Selectively Oxidized Vertical-Cavity Surface-Emitting Lasers, Vertical-Cavity Surface-Emitting Lasers: Technology and Applications, vol. 10, Chapter 1, pp. 1-61.

H.C. Casey, Jr., et al., Heterostructure Lasers, Quantum Electronics—Principles and Applications A Series of Monographs, Part A Fundamental Principals, pp. 29-79, 1978.

* cited by examiner

SEMICONDUCTOR LASER BASED ON THE EFFECT OF PHOTONIC BAND GAP CRYSTAL-MEDIATED FILTRATION OF HIGHER MODES OF LASER RADIATION AND METHOD OF MAKING SAME

REFERENCE TO RELATED APPLICATIONS

This is a divisional patent application of application Ser. No. 09/946,016, filed Sep. 4, 2001, now U.S. Pat. No. 6,804,280 entitled "A SEMICONDUCTOR LASER BASED ON THE EFFECT OF PHOTONIC BAND GAP CRYSTAL-MEDIATED FILTRATION OF HIGHER MODES OF LASER RADIATION AND METHOD OF MAKING SAME", The aforementioned application is hereby incorporated herein by reference.

BACKGROUND OF THE INVENTION

1. Field of the Invention

The invention pertains to the field of semiconductor devices. More particularly, the invention pertains to a semiconductor laser with a low beam divergence.

2. Description of Related Art

High power semiconductor lasers play an important role in telecommunication systems, serving as pumps, fiber amplifiers and in other applications.

To obtain a low power density per facet and a low beam divergence for an edge-emitting laser, generally an extended waveguide is used. However, significant narrowing of the far field pattern is limited by multi-mode laser radiation.

Prior art in the field of edge-emitting lasers with a low beam divergence includes the concept of a leaky wave diode laser that, in principle, obtains low beam divergence. An example of this prior art is U.S. Pat. No. 4,328,469, issued May 4, 1982, entitled "HIGH OUTPUT POWER INJECTION LASERS". This patent discloses a heterostructure injection laser with an active layer sandwiched between a pair of intermediate index layers. A layer with a very thin low refractive index and high bandgap may be located between an active layer and an intermediate layer. The thin layer may be applied in various combinations to produce fundamental mode guiding effects.

The major disadvantage of such devices is an extremely small confinement factor of the fundamental mode. One cannot fabricate a high power laser based on this effect. Therefore, there is a need in the art for a laser realizing both a low beam divergence and high power output.

SUMMARY OF THE INVENTION

A semiconductor laser having a low beam divergence is disclosed. The laser includes at least one waveguide comprising an active layer generating an optical gain by injection of a current, a photonic band gap crystal having the refractive index modulation in the direction perpendicular to the propagation of the emitted light, and at least one defect. The active layer is preferably placed within the defect. The photonic band gap crystal and the defect are optimized such that the fundamental mode of laser radiation is localized at the defect and decays away from the defect, while the other optical modes are extended over the photonic band gap crystal. Localization of the fundamental mode at the defect results in the relative enhancement of the amplitude of the mode with respect to the other modes. Therefore, there is a larger confinement factor of the fundamental mode as compared to the confinement factor of the other modes. This enables efficient single-mode lasing from the laser having an extended waveguide.

DETAILED DESCRIPTION OF THE INVENTION

Figure 1:
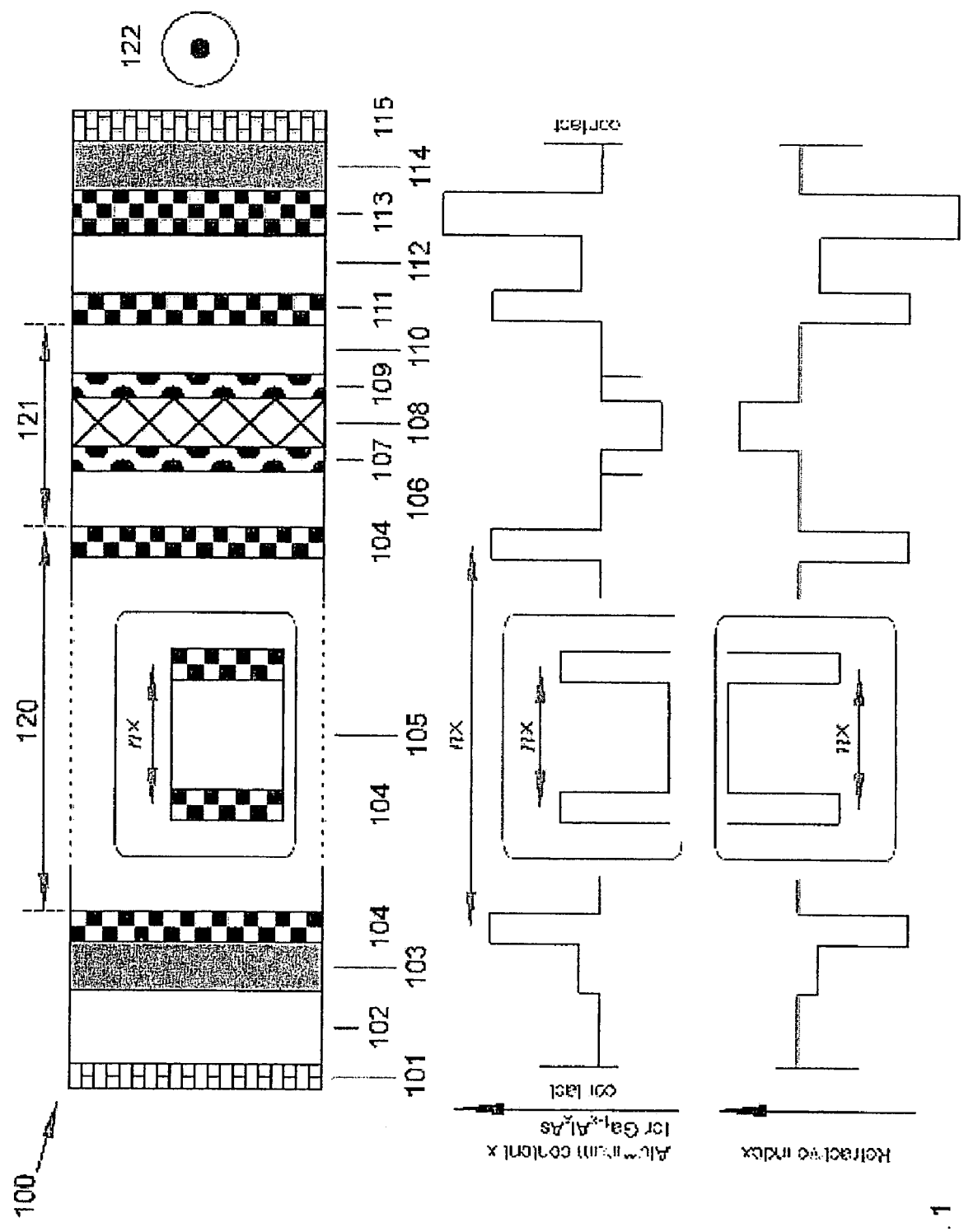
FIG. 1 shows a schematic diagram of one embodiment of a laser of the present invention where the waveguide in the laser structure contains a photonic band gap crystal realized by a periodic sequence of alternating layers with a low and a high refractive index, and a defect, which localizes photons. The refractive index profile for the given embodiment is also shown. The alloy composition profile is shown for a particular embodiment where the modulation of the refractive index is realized by the modulation of alloy composition x in a $Ga_{1-x}Al_xAs$ alloy.

An objective of edge-emitting semiconductor lasers of the present invention is to obtain a narrow far-field pattern of the radiation. This task is usually addressed by using an extended waveguide. The main disadvantage of current waveguides is the multi-mode nature of laser radiation that leads to a complex far-field pattern and a wide beam divergence. To suppress the higher modes and, at the same time to provide a reasonable confinement factor of the fundamental mode, a special design of the waveguide is required.

The present invention teaches using a photonic band gap crystal in geometry where the generated light propagates perpendicular to the direction of the refractive index modulation. In particular, for an edge-emitting semiconductor laser of the present invention, the photonic band gap crystal is a one-dimensional periodic structure of layers, in which the refractive index n is modulated in the vertical direction z, n=n(z). Then, the electric field strength, say in the TE-modes, can be written in the form:

$$E_y(x,z,t) = E_y(z)\exp[i(\beta x - \omega t)], \quad (1)$$

where the $\exp[i\beta x]$ represents the propagation along the waveguide in the x-direction, and the amplitude $E_y(z)$ depicts the variation of the electric field strength across the waveguide. The latter obeys the wave equation (see, e.g., H. C. Casey, Jr. and M. B. Panish, Semiconductor Lasers, Part A, Academic Press, N.Y., 1978, pp. 32–43 and 70–79):

$$-\frac{\partial^2 E_y}{\partial z^2} + \left[\beta^2 - \frac{\omega^2}{c^2}n(z)\right]E_y = 0. \quad (2)$$

In an infinite, perfectly periodic photonic band gap crystal, the spectrum comprises allowed bands in the frequency $\omega$ and the constant $\beta$, for which the electromagnetic waves are periodic waves propagating throughout the crystal, and forbidden gaps, for which no propagation of an electromagnetic wave is possible. In any real system, a perfect periodicity is broken by either termination of a sequence of layers or any type of defect violating the periodical profile of the refractive index. Such a defect can be either localizing or delocalizing for electromagnetic waves in the z-direction. In the case of a localizing defect, two types of electromagnetic waves are possible. These are a) waves localized by the defect in the z-direction and propagating along the waveguide in the x-direction, and b) waves extended over the photonic band gap crystal in the z-direction and propagating along the waveguide in the x-direction.

Therefore, the edge-emitting laser of the present invention includes two primary elements: 1) a photonic band gap crystal with the refractive index modulation in a vertical direction and 2) a defect in which the active region of the laser is preferably placed. The photonic band gap crystal and its defect are designed in such a way that one and only one mode of laser radiation is localized by the defect and decays away from the defect in the z-direction while the other modes are extended in the z-direction over the photonic band gap crystal.

The ability of the defect to localize modes of laser radiation is governed by two parameters. The first parameter is the difference between the refractive indices of the defect and the reference layer of the photonic band gap crystal, $\Delta n$. The second parameter is the volume of the defect. For the lasers of the present invention, in which the refractive index is modulated in one direction only, n=n(z), the second parameter is the thickness of the defect. Generally, as the value of $\Delta n$ increases at a fixed defect thickness, the number of modes being localized by the defect also increases. As the thickness of the defect increases at a fixed $\Delta n$, the number of modes being localized by the defect also increases. The design of the lasers of the present invention choose these two parameters, $\Delta n$ and the thickness of the defect, so that one and only one mode of laser radiation is localized by the defect. The other modes are extended modes in the z-direction over the photonic band gap crystal.

A preferred embodiment of the invention provides a laser with an active region placed in the defect region of the waveguide where the fundamental mode of laser radiation is localized. The required localization length of the fundamental mode is determined by the interplay of two tendencies. On the one hand, the localization length needs to be large enough to provide a low far-field beam divergence. On the other hand, the localization length should be sufficiently shorter than the length of the photonic band gap crystal. This provides efficient localization of the fundamental mode on the scale of the total thickness of the photonic band gap crystal and therefore a significant enhancement of the electric field strength in the fundamental mode compared to that of the other modes. A particular embodiment of the laser of the present invention achieves a beam divergence of 4° while the confinement factor is 0.11 of that in a standard double heterostructure laser having a 0.8 μm GaAs cavity and $Ga_{1-x}Al_xAs$ cladding layers, where x=0.3.

Referring specifically to FIG. 1, a first example of a novel edge-emitting semiconductor laser (100) is shown using photonic band gap crystal-based filtration of higher modes of laser radiation made in accordance with the present invention. The structure is grown epitaxially on the substrate (102), followed by an n-doped buffer layer (103).

The substrate (102) is preferably formed from any III–V semiconductor material or III–V semiconductor alloy, e.g. GaAs, InP, GaSb, or others. GaAs is the preferred substrate (102) for the present invention. The n-emitter (103) is preferably formed from a material lattice-matched or nearly lattice-matched to the substrate, transparent to the generated light, and doped by donor impurities. In a preferred embodiment, n-emitter (103) is made of the same material as that of the substrate, e.g. GaAs. Possible donor impurities for this layer (103) include, but are not limited to S, Se, Te or amphoteric impurities like Si, Ge and Sn. The latter group of impurities is introduced under such technological conditions that they are incorporated predominantly into the cation sublattice and serve as donor impurities. For example, n-doped layers are GaAs or GaAlAs layers grown by molecular beam epitaxy and doped by Si impurities with the concentration $2 \times 10^{17}$ cm$^{-3}$, n$^+$-doped layer (103) is a GaAlAs layer grown by molecular beam epitaxy and doped by Si impurity with the concentration $3 \times 10^{18}$ cm$^{-3}$. In a preferred embodiment, the n-doped layer (103) comprises more than one layer, e.g., a layered n$^+$-n structure, etc.

These layers are followed by a photonic band gap crystal (120), which includes n periods. Each period includes an n-doped layer (104) having a low refractive index and an n-doped layer (105) having a high refractive index. Thus, the photonic band gap crystal (120) includes n periods each of which includes a layer (104) and a layer (105). The photonic band gap crystal (120) is preferably formed from a material lattice-matched or nearly lattice-matched to the substrate (102) and transparent to the emitted light. In the example of a device on a GaAs-substrate, the preferred embodiment is the alloy Ga$_{1-x}$Al$_x$As with a modulated aluminum composition x. All the layers (104) and (105) of the photonic band gap crystal (120) must be n-doped. The number of periods, the thickness of each layer, and the alloy composition in each layer are chosen to provide the localization of one and only one mode of laser radiation in the z-direction.

Figure 17:
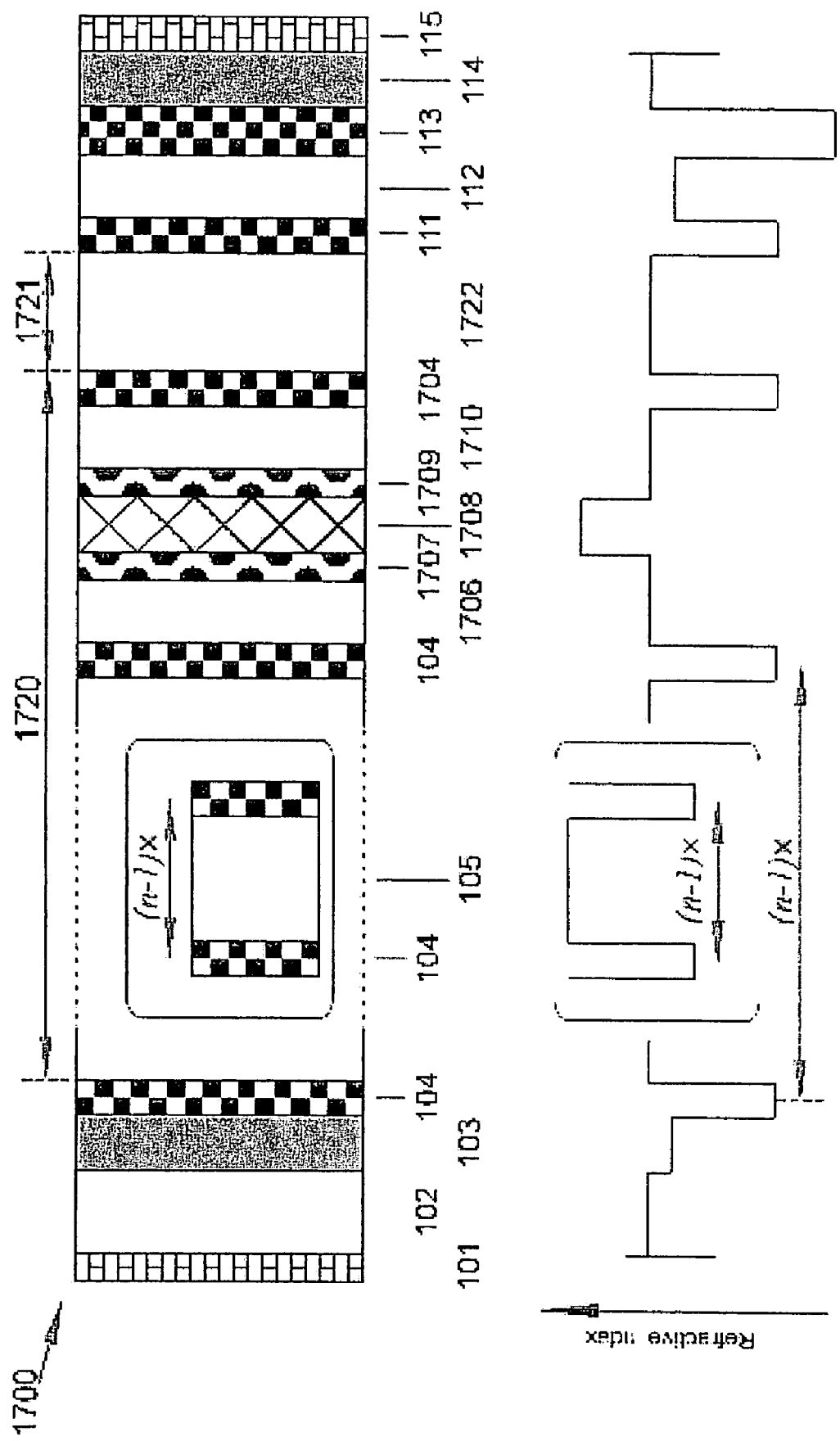
FIG. 17 shows a schematic diagram of another embodiment of the present invention in which the active region is placed in one of the layers of the photonic band gap crystal, and the defect localizing photons has only passive elements.

The photonic band gap crystal (120) is surrounded on one side by a layer (104) having a low refractive index and from the other side by the defect (121). The periodic sequence of layers of the photonic band gap crystal (120) is followed by a specially designed defect (121) which includes a thick n-doped layer (106), a relatively thin weakly n-doped or undoped layer (107), an active region (108), a weakly p-doped or undoped layer (109), and a thick p-doped layer (110). The defect (121) localizes photons. The active region (108), or light-generating layer, is preferably placed within the defect (121). However, as shown in FIG. 17, the active region (108) can also be located outside the defect (121). The layers (106) and (110) are preferably formed of a material lattice-matched or nearly lattice-matched to the substrate (102) and transparent to the emitted light. In the example of the device on a GaAs-substrate (102), preferred materials for layers (106) and (110) are GaAs or Ga$_{1-x}$Al$_x$As. Preferred materials for weakly doped or undoped layers (107) and (109) include GaAs or Ga$_{1-x}$Al$_x$As.

The active region (108) is preferably formed by any insertion, the energy band gap of which is narrower than that of the substrate (102). Possible active regions (108) include, but are not limited to, a single-layer or a multi-layer system of quantum wells, quantum wires, quantum dots, or any combination thereof. In the example of the device on a GaAs-substrate, preferred embodiments for the active element include, but are not limited to, a system of insertions of InAs, In$_{1-x}$Ga$_x$As, In$_x$Ga$_{1-x-y}$Al$_y$As, In$_x$Ga$_{1-x}$As$_{1-y}$N$_y$ or similar materials. Light (122) is emitted from the edge of the laser (100). The light (122) propagates perpendicular to the plane of FIG. 1.

The defect (121) is followed by a p-doped layer (111) having a low refractive index, a p-doped layer (112) having an intermediate refractive index, a thick p-doped layer (113) having a low refractive index, and a thick p-doped buffer layer (114). The layers (111), (112) and (113) are p-doped and are preferably formed from a material lattice-matched or nearly lattice matched to the substrate (102) and transparent to the emitted light. In the example of a device on a GaAs-substrate, the preferred material for these layers is the alloy Ga$_{1-x}$Al$_x$As with the modulated aluminum composition x. The layer (111) preferably has a low refractive index, the layer (112) preferably has an intermediate or high refractive index and the layer (113) preferably has a low refractive index.

The p-doped contact layer (114) is preferably formed from a material, lattice-matched or nearly lattice-matched to the substrate (102), transparent to the generated light, and doped by an acceptor impurity. In a preferred embodiment, this layer (114) is the same material as the substrate, e.g. GaAs. Possible acceptor impurities include, but are not limited to Be, Mg, Zn, Cd, Pb, Mn or amphoteric impurities like Si, Ge and Sn. The latter group of impurities is introduced under such technological conditions that they are incorporated predominantly into the anion sublattice and serve as acceptor impurities. For example, p-doped layers are GaAs or GaAlAs layers grown by molecular beam epitaxy and doped with Be impurity with the concentration $2 \times 10^{17}$ cm$^{-3}$, a p$^+$-doped layer is GaAlAs layer grown by molecular beam epitaxy doped with Be impurity with the concentration $2 \times 10^{19}$ cm$^{-3}$. In a preferred embodiment, the p-doped layer (114) includes more than one layer, e.g. a layered p-p$^+$ structure, etc. Preferred numerical values for the refractive indices of various layers are given below, in the discussion of FIG. 6.

The entire structure is placed between an n-contact (101) and a p-contact (115). Contact layers (101) and (115) are preferably formed from multi-layered metal structures. The n-contact (101) is preferably formed from materials including, but not limited to, the three-layered structure Ni—Au—Ge. The p-contact (115) can be formed from materials including, but not limited to, the three-layered structure Ti—Pt—Au.

The waveguide of the laser (100) preferably includes the photonic band gap crystal (120), the defect (121), the layer (111) having a low refractive index, and the layer (112) having an intermediate refractive index. The layer (104) sitting a top the n-emitter (103) and the layer (113) serve as cladding layers for the laser (100). The photonic band gap crystal (120), the number of periods, the period, the thickness and the refractive index of each layer within the period of the photonic band gap crystal (120), as well as the structure of the defect (121), are all designed in a way that one and only one TE mode of laser radiation is localized at the defect (121), while all the other modes are extended over the photonic band gap crystal (120). An asymmetric design of the laser (100) is chosen to reduce the total width of the p-doped regions (111), (112), (113) and (114) and thus to reduce the total resistance of the structure. That is why the defect (121) in which the active region (108) is preferably located is shifted towards the p-contact (115). The thick p-doped layer (113) is used to prevent the extension of the fundamental mode to the absorbing p-doped contact layer (114) near the p-contact (115) or to the p-contact (115) itself. The additional layer (112) having an intermediate refractive index is used to reduce the influence of the layer (113) on the laser mode in the defect region (121) and thus to keep a large electric field strength in the fundamental mode in the active region (108). In general, layers (111) and (112) are not necessary parts of the laser of the present invention.

The desired refractive index profile throughout the entire structure is calculated as follows. A model structure is introduced. The fundamental TE-mode and the high-order TE modes are obtained from the solution of the eigenvector problem for Equation (2). As the fundamental mode is calculated, the far field pattern is calculated by using the method, given, e.g., in H. C. Casey, Jr. and M. B. Panish, *Semiconductor Lasers*, Part A, Academic Press, N.Y., 1978, Chapter 2. The desired structure is obtained as a result of the optimization providing the preferred interplay between the lowest beam divergence, the maximum amplitude of the fundamental mode in the active medium, and the lowest ratio of the amplitudes of the higher modes at the active medium to that of the fundamental mode.

Figure 2:
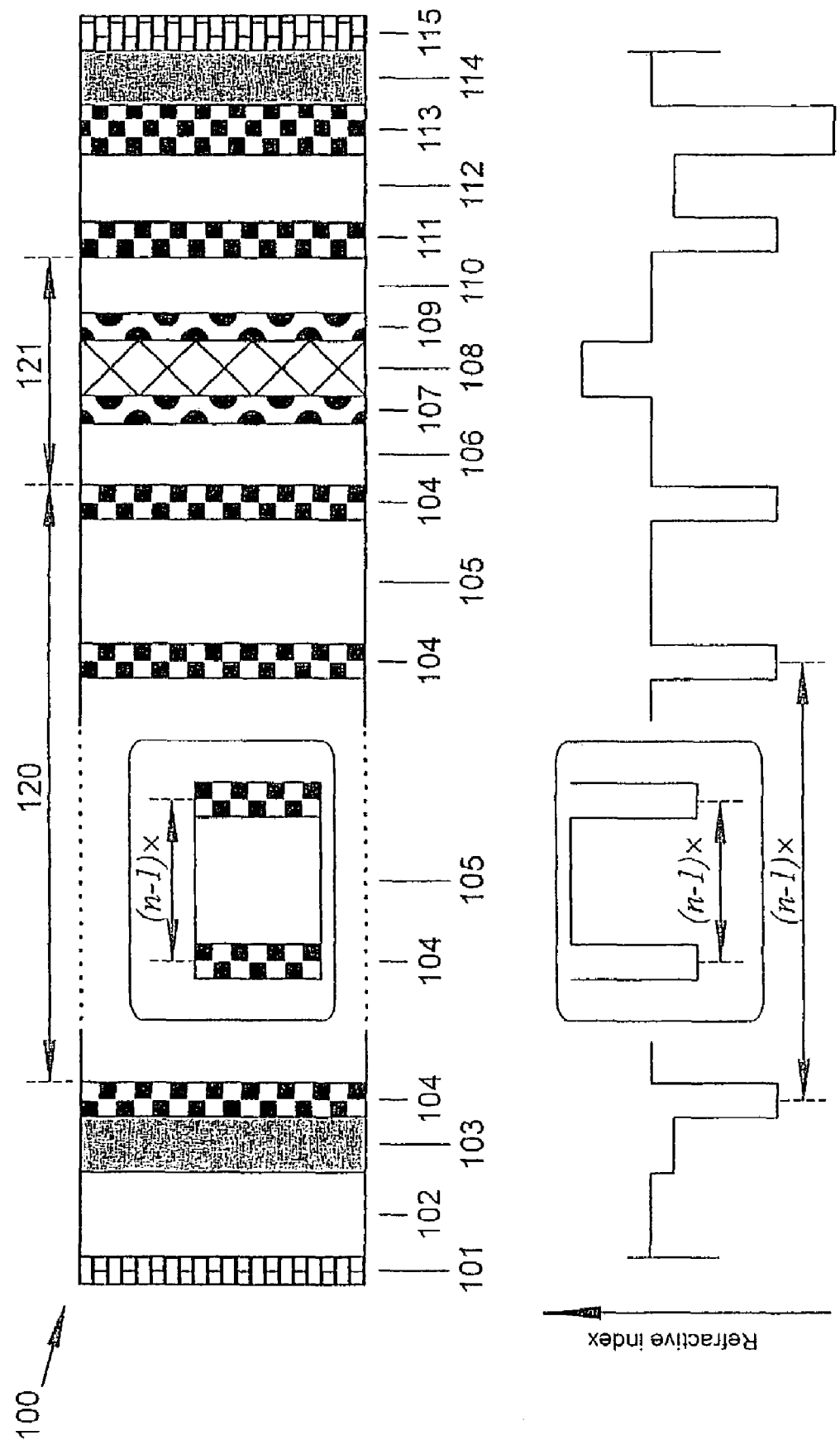
FIG. 2 shows a schematic diagram of one embodiment of a laser of the present invention, where a single layer with a high refractive index is included in the defect, where the thickness of this layer exceeds the thickness of the layers in the photonic band gap crystal having a high refractive index.

FIG. 2 shows a particular embodiment of the present invention where the defect (121) includes layers (106), (107), (108), (109), and (110). Together, layers (106), (107), (109), and (110) of the defect (121) preferably have the same high refractive index as each layer (105) and are thicker than the layers (105). All layers (105) shown in the embodiment of FIG. 2 have the same thickness. One layer (105) is shown in FIG. 2 as well as in the FIGS. 3–5 to demonstrate various possible embodiments of the laser of the present invention. Due to the localization of the fundamental mode by the defect (121), the electric field strength in the fundamental mode in the active region is substantially higher than in other modes. A comparison with the first-order TE mode is shown in FIG. 6. The enhancement of one and only one mode in the active region allows an efficient filtration of the modes and realization of single-mode lasing.

Figure 3:
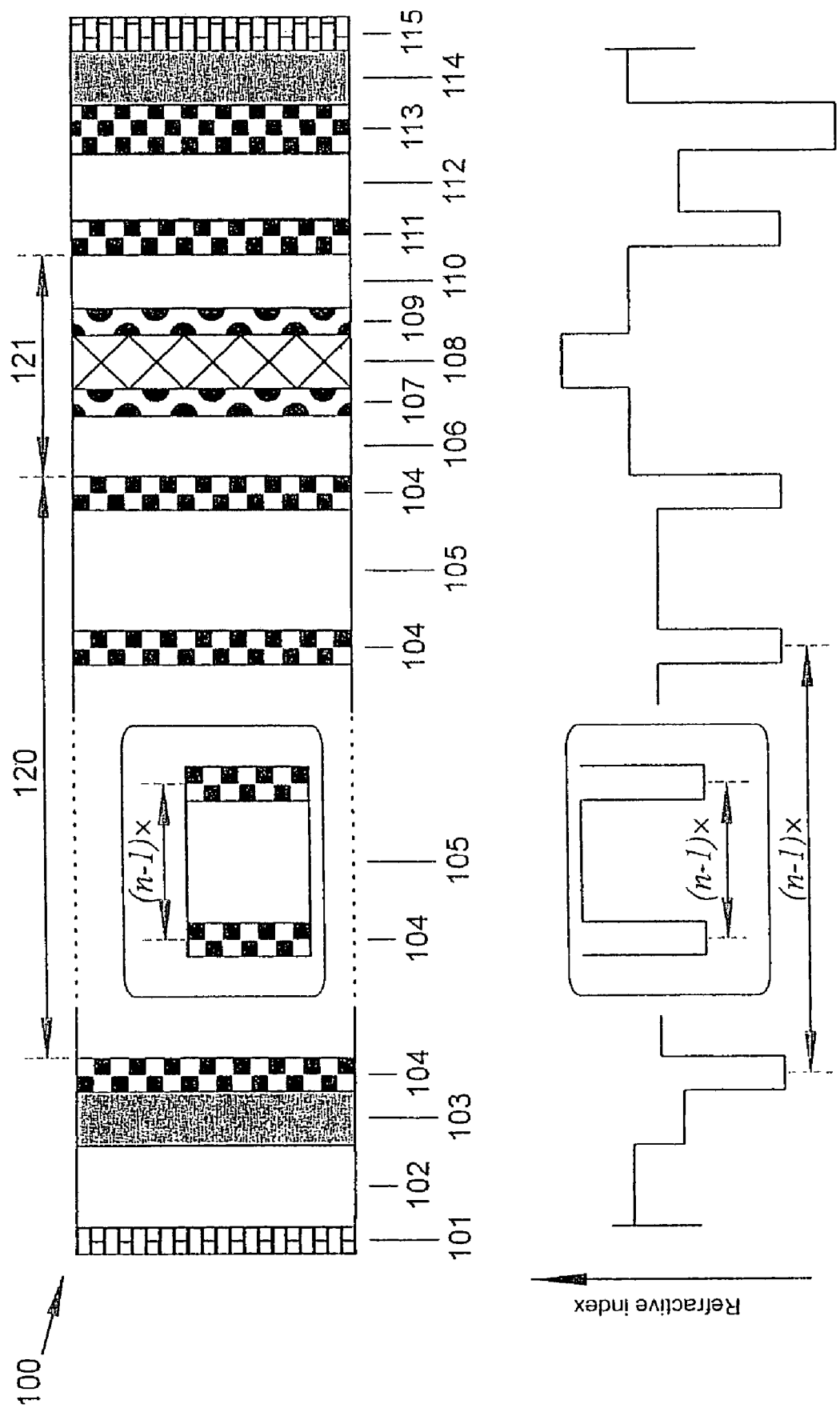
FIG. 3 shows a schematic diagram of another embodiment of the present invention, in which a single layer having a higher refractive index than the layers of the photonic band gap crystal is part of the localizing defect.

FIG. 3 shows another embodiment of the present invention where the defect (121) includes layer (106), (107), (108), (109), and (110). The refractive index in layers (106), (107), (109) and (110) together have the same thickness as each layer (105) and a refractive index higher than the refractive index in each layer (105). Since the defect region (121) has such a high refractive index, it is designed to localize the fundamental mode of laser radiation.

Figure 4:
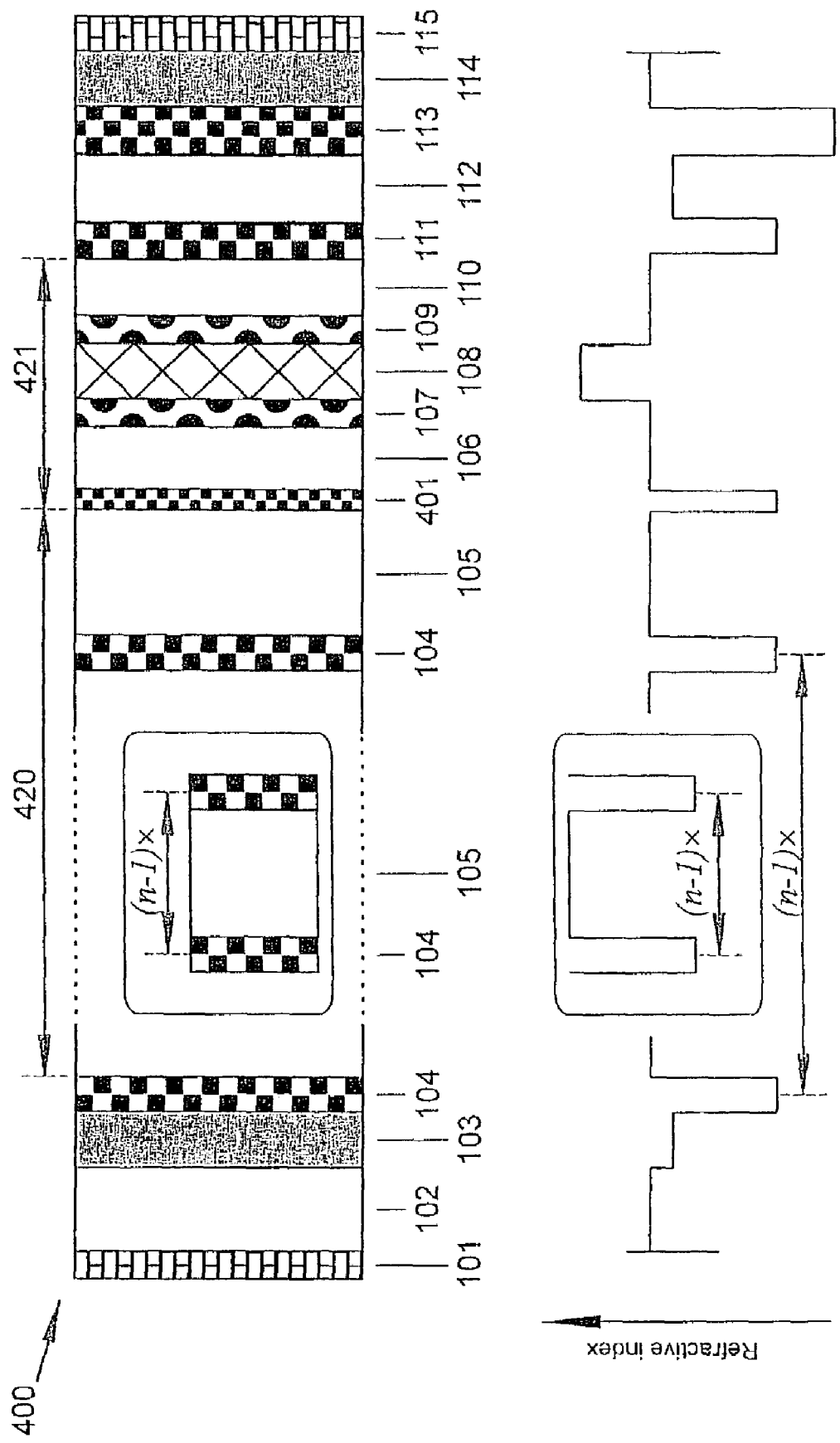
FIG. 4 shows a schematic diagram of another embodiment of the present invention, in which a single layer having a low refractive index separates two adjacent layers with a high refractive index, the separating layer being thinner than the other layers of the photonic band gap crystal having a low refractive index.

FIG. 4 shows another embodiment of the present invention (the laser (400)) where the defect (421) includes a layer (401) with a low refractive index. Layer (401) is thinner than layer (104) of the photonic band gap crystal (420). Contrary to the embodiments shown in FIGS. 1–3, the layer (401) having a different thickness compared with the other layers (104) is no longer a part of the photonic band gap crystal (420), but a part of the defect (421). The refractive index of layer (401) is the same as layers (104). Due to a reduced thickness of the layer (401), tunneling of electromagnetic waves between adjacent layers surrounding layer (401) is enhanced. Therefore, the layer (105) adjacent to the layer (401), and the defect (421) tend to localize electromagnetic waves. The layer (401) is preferably formed from a material lattice-matched or nearly lattice-matched to the substrate (102) and is transparent to the emitted light. In a preferred embodiment, layer (401) is made of the same material as layers (104).

Figure 5:
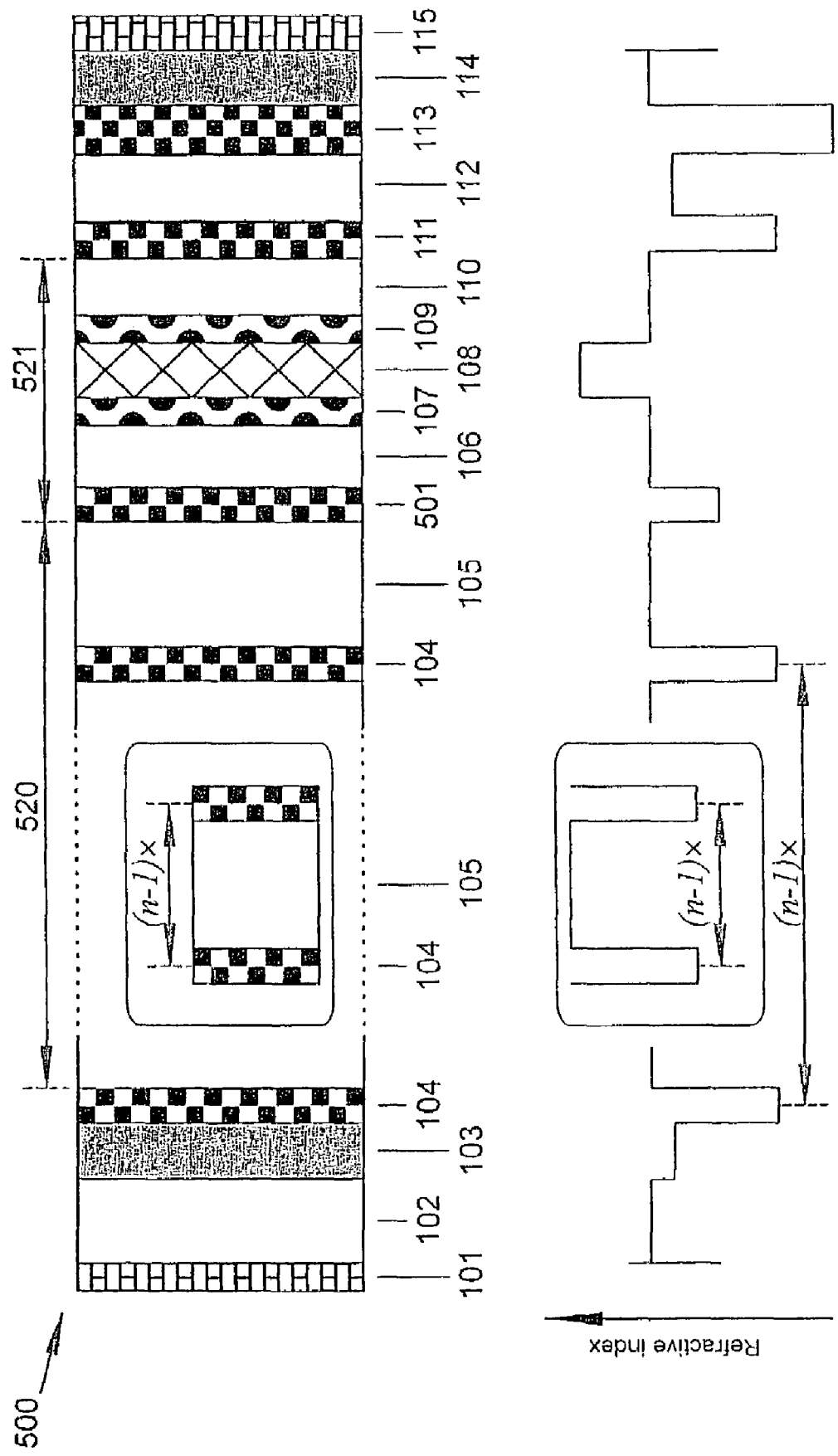
FIG. 5 shows a schematic diagram of another embodiment of the present invention, in which a single layer having an intermediate refractive index separates two adjacent layers with a high refractive index.
Figure 6:
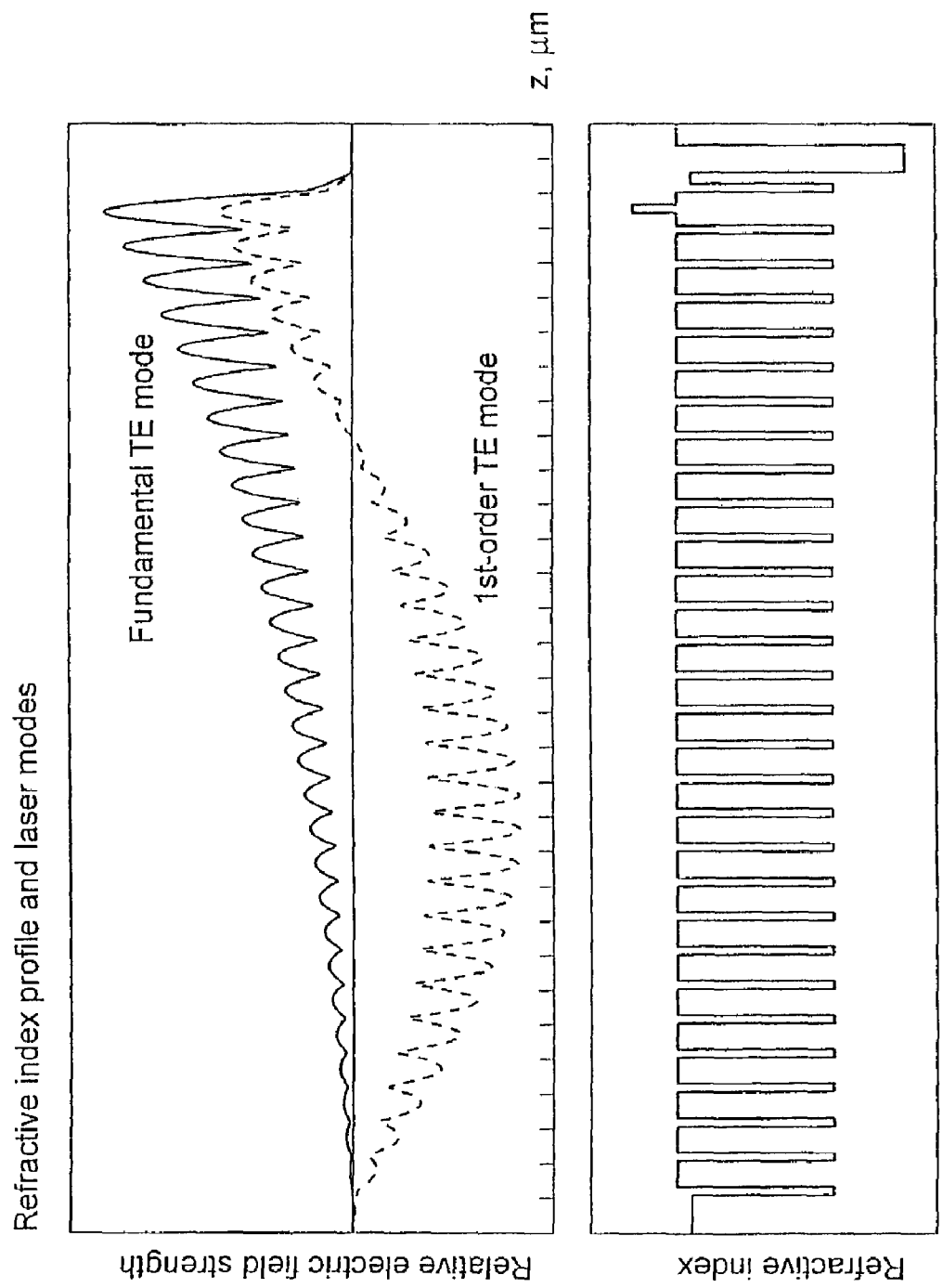
FIG. 6 shows the relative electric field strength in the fundamental transverse electric (TE) mode and first order TE mode and refractive index for the laser shown in FIG. 2.

FIG. 5 shows another embodiment of the present invention (the laser (500)) where the layer (501) separates two layers (105) and (106) with high refractive indexes. Layer (501) has an intermediate refractive index between the refractive index of the layers (104) and (105) of the photonic band gap crystal (520). Due to the layer's (501) intermediate refractive index, tunneling of electromagnetic waves between adjacent layers surrounding the layer (501) is enhanced. Therefore, the layer (105) adjacent to the layer (501) and the defect (521) tend to localize electromagnetic waves. The layer (501) is preferably formed from a material lattice-matched or nearly lattice-matched to the substrate and is transparent to the emitted light. In a preferred embodiment, layer (501) is made of $Ga_{1-x}Al_xAs$ with the aluminum content x intermediate between the aluminum content for layers (104) and layers (105).

FIG. 6 depicts a profile of the fundamental TE mode and the first-order TE mode in the z-direction for a particular realization of a laser of the present invention. Particularly, this figure represents the laser (100) of the embodiment of FIG. 2. The photonic bandgap crystal (120) comprises 28 periods each of which comprises a single layer (104) having a low refractive index and a single layer (105) having a high refractive index. A defect (121) is realized by a layer having a high refractive index and a thickness exceeding the thickness of the layers (105). In this example, layers (104) and layer (111) each have a preferred thickness of 90 nm and are made of $Ga_{1-x}Al_xAs$, where x=0.55. Layers (105) have a preferred thickness of 900 nm and are made of GaAs. The defect (121) has a preferred thickness of 1.0 µm. The layer (112) has the thickness 400 nm and is formed of $Ga_{1-x}Al_xAs$, where x=0.05. For the laser in this particular embodiment, the refractive index of the layers (105), (106), and (110) preferably equals 3.590, the refractive index of the layers (104) and (111) preferably equals 3.227, the refractive index of the layers (103) and (112) preferably equals 3.555, and the refractive index of layer (113) preferably equals 3.080. FIG. 6 shows that the electric field strength in the fundamental TE mode in the active region is approximately twice as large as that of the first-order TE mode. It is valid for all higher modes. Such an embodiment allows single-mode lasing with a far-field beam divergence of $1.7°$.

Other embodiments of the present invention include structures where a localizing defect is realized by combining some or all of the variations shown in FIG. 2 through FIG. 5. In additional embodiments, a localizing defect is distributed over more than one period of the photonic band gap crystal. Still more embodiments localize the fundamental TE-mode by some aperiodic modulation of the refractive index. Other embodiments of the present invention include structures where photonic band gap crystals extend on both sides of the localizing defect.

Figure 7:
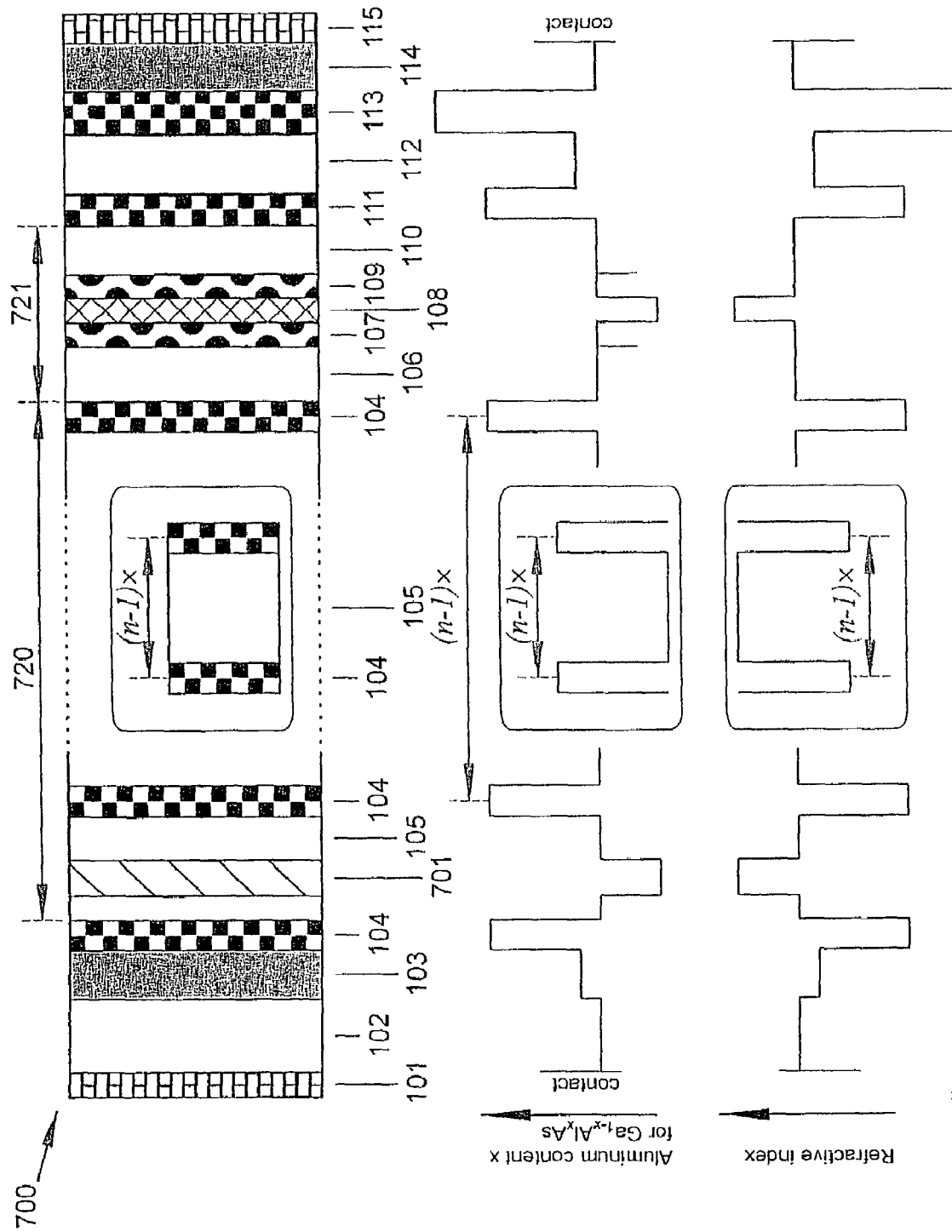
FIG. 7 shows a schematic diagram of another embodiment of the present invention, in which an absorber layer is placed in one of the layers of the photonic band gap crystal.

FIG. 7 shows another embodiment of the present invention (the laser (700)) that teaches the use of an absorber layer (701) to suppress higher modes of laser radiation. The absorber layer (701) is a layer having a high absorption coefficient for the emitted light. The absorber layer (701) is preferably placed in layer (105) of the photonic band gap crystal (720), which has a high refractive index and is located at the opposite side of the photonic band gap crystal (720) as the defect (721), which contains the active region (108). Using an absorber layer (701) provides the following advantages. The electric field strength in the fundamental mode decays away from the defect (721). This decay, in general, follows some decreasing exponential modulated by an oscillating factor. In other words, the maximum value of the electric field strength within a given period of the photonic band gap crystal (720) decays exponentially away from the defect (721). On the other hand, none of the higher-order modes exhibit any decay. Due to this phenomenon, the electric field in the fundamental mode far from the defect (721) is significantly, e.g. by an order of magnitude or more, weaker than that in the other modes. Placing an absorber layer (701) with a high absorption coefficient for the emitted light in the photonic band gap crystal (720) at this location provides efficient suppression of the high-order modes while the fundamental mode is not affected. This effect enables the suppression of higher modes of laser radiation and realizes single-mode lasing. Note that both the active region (108) and the absorber (701) have a typical thickness of about 10 nm that do not affect significantly the profile of modes of laser radiation. Therefore, the layer (105) in which the absorber (701) is placed is considered as a part of the photonic band gap crystal (720).

In alternative embodiments of the present invention, the absorber layer (701) is placed not inside the first layer (105) of the photonic band gap crystal (720), but inside one of the next layers (105). Other embodiments include more than one absorber layer (701) placed in several periods of the photonic band gap crystal (720).

Figure 8:
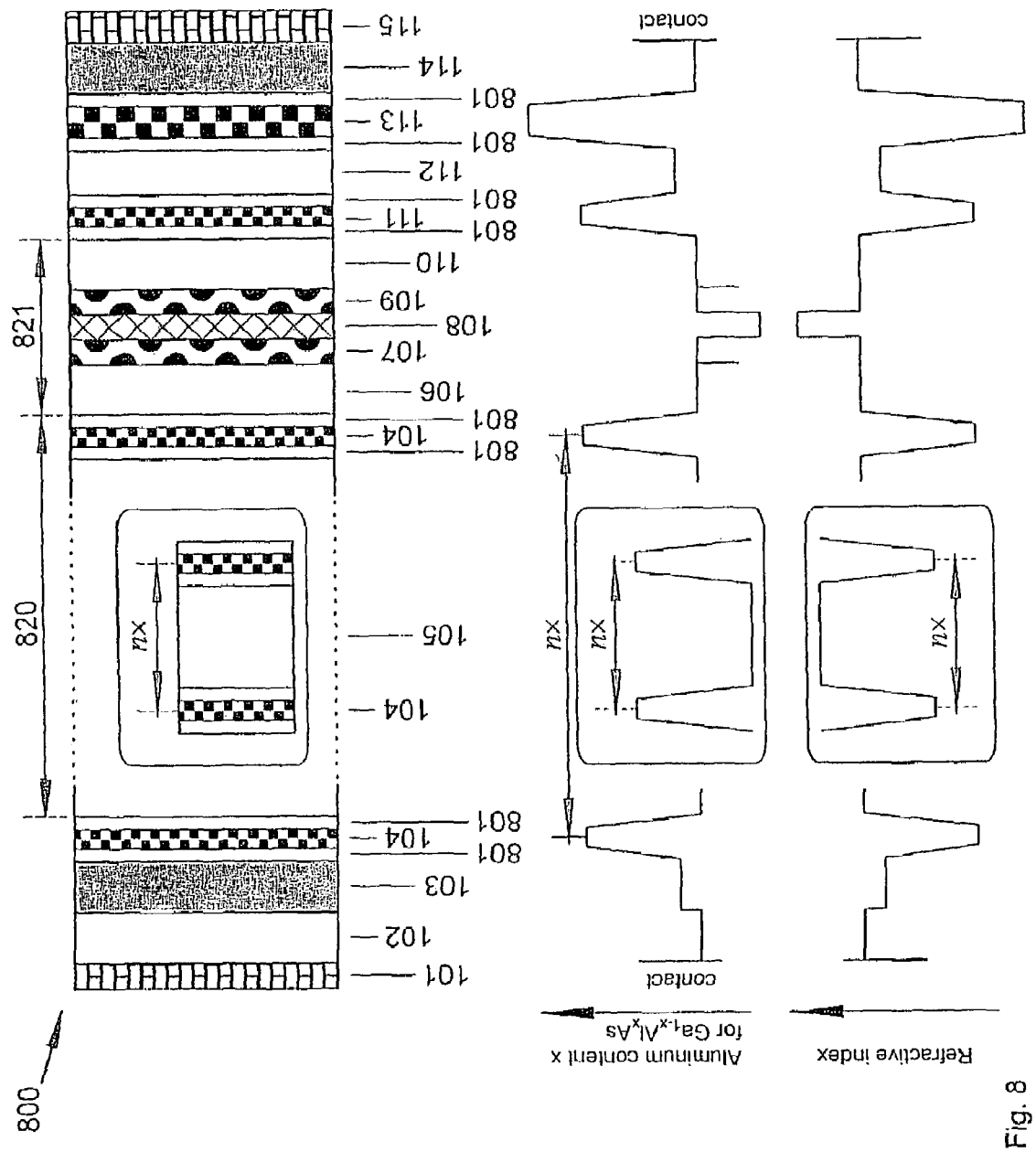
FIG. 8 shows a schematic diagram of another embodiment of the present invention, in which layers with a high refractive index and layers with a low refractive index are separated by graded-index layers.

FIG. 8 shows another embodiment of the present invention (the laser (800)). This embodiment is similar to the laser shown in FIG. 1, with the addition of graded index layers (801) introduced between each layer with a low refractive index and a neighboring layer having a high refractive index. The usage of graded index layers (801) is a standard one for semiconductor lasers based on GaAs/Ga$_{1-x}$Al$_x$As heterostructures. The graded index layers (801) provide a continuous variation of the refractive index. A graded index is realized by graded aluminum content x in the layers (801) and serves for the reduction of resistance of the heterostructure. The thickness of the graded index layers (801) preferably exceeds the Debye radius of electrons, which at typical doping level in semiconductor lasers is about 100 Å.

Figure 9:
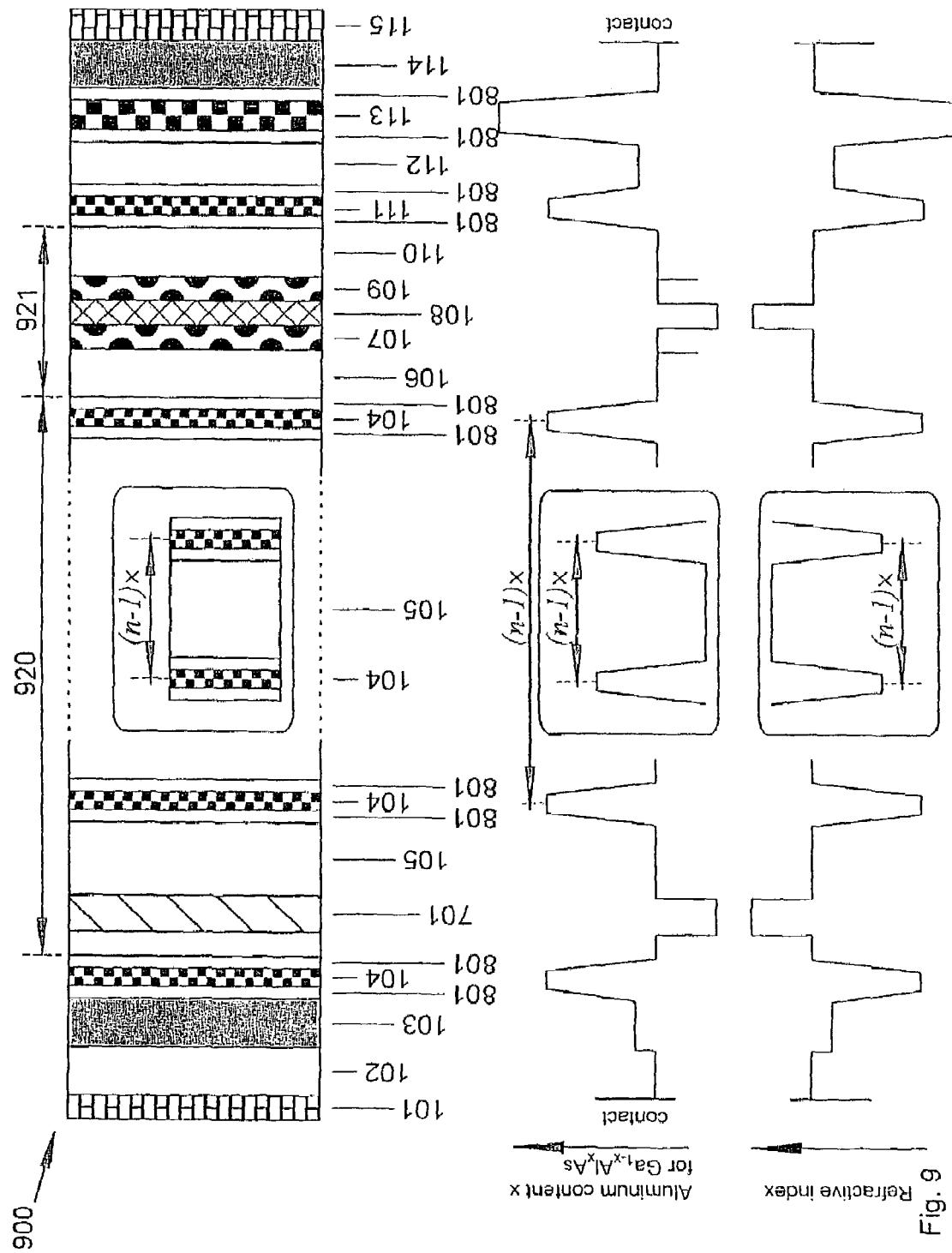
FIG. 9 shows a schematic diagram of another embodiment of the present invention, in which an absorber layer is placed in one of the layers of the photonic band gap crystal and graded-index layers separate layers with a high refractive index from layers with a low refractive index.

FIG. 9 shows another embodiment of the present invention (the laser (900)), which is similar to the embodiment shown in FIG. 7. In addition to the absorber layer (701), graded index layers (801) are introduced between each layer with a low refractive index and a neighboring layer with a high refractive index. The absorber layers (701) suppress extended modes, while the graded-index layers (801) provide continuous variation of the refractive index. For example, in a semiconductor laser (900) based on GaAs/Ga$_{1-x}$Al$_x$As heterostructure, index layers (801) contain a graded aluminum content x.

To illustrate the performance of a realistic edge-emitting laser of the present invention, the particular embodiment shown in FIG. 9 based on a graded GaAs/Ga$_{1-x}$Al$_x$As heterostructure and containing an absorber layer (701) is used as an example. The modes are calculated for the particular structure with the refractive index profile shown at the bottom of FIG. 10. The photonic band gap crystal (920) of FIG. 9 contains n=13 periods. The layers (105) having a high refractive index are preferably formed from GaAs and have a thickness of approximately 0.8 μm. The defect (921), which includes layers (106), (107), (108), (109), and (110), has a thickness of approximately 0.9 μm. The active region (108) is placed in the middle of the defect (921). The layers (104) with a low refractive index are formed from Ga$_{1-x}$Al$_x$As, where x=0.55, and preferably have a thickness of approximately 600 Å. The graded index layers (801) preferably have a thickness of approximately 400 Å. The layer (112), used to provide the attenuation of the fundamental mode before the p-contact layer (114), is approximately 0.3 μm thick, and is preferably formed from Ga$_{1-x}$Al$_x$As, where x=0.05. Layer (113) has an aluminum content of 0.8 and a thickness of approximately 0.3 μm. The absorber layer (701) is placed at the first period of the photonic band gap crystal (920) from the substrate (102) side. The absorber layer (701) is placed in the layer (105) asymmetrically closer to the layer boundary from the substrate (102) side. Its distance from the layer boundary is preferably 0.1 μm. The particular design of the waveguide is calculated for the emitted wavelength 0.98 μm. The waveguide of the laser of the embodiment of FIG. 9 includes the graded index layer (801), n periods of the photonic band gap crystal (920), the defect (921), the graded index layer (801), the layer (111) having a low refractive index, the graded index layer (801), the layer (112) having an intermediate refractive index, and the graded index layer (801). The thickness of all layers forming the waveguide, except the thickness of the active layer and the absorber, scale proportionally to the emitted wavelength. For the laser in the embodiment of FIG. 9, the refractive index of the layers (105), (106), and (110) preferably equals 3.590, the refractive index of the layers (104) and (111) preferably equals 3.227, the refractive index of the layers (103) and (112) preferably equals 3.555, and the refractive index of layer (113) preferably equals 3.080. The refractive index of each of the graded-index layers (801) changes gradually between the values of the refractive indices of the adjacent layers.

Figure 10:
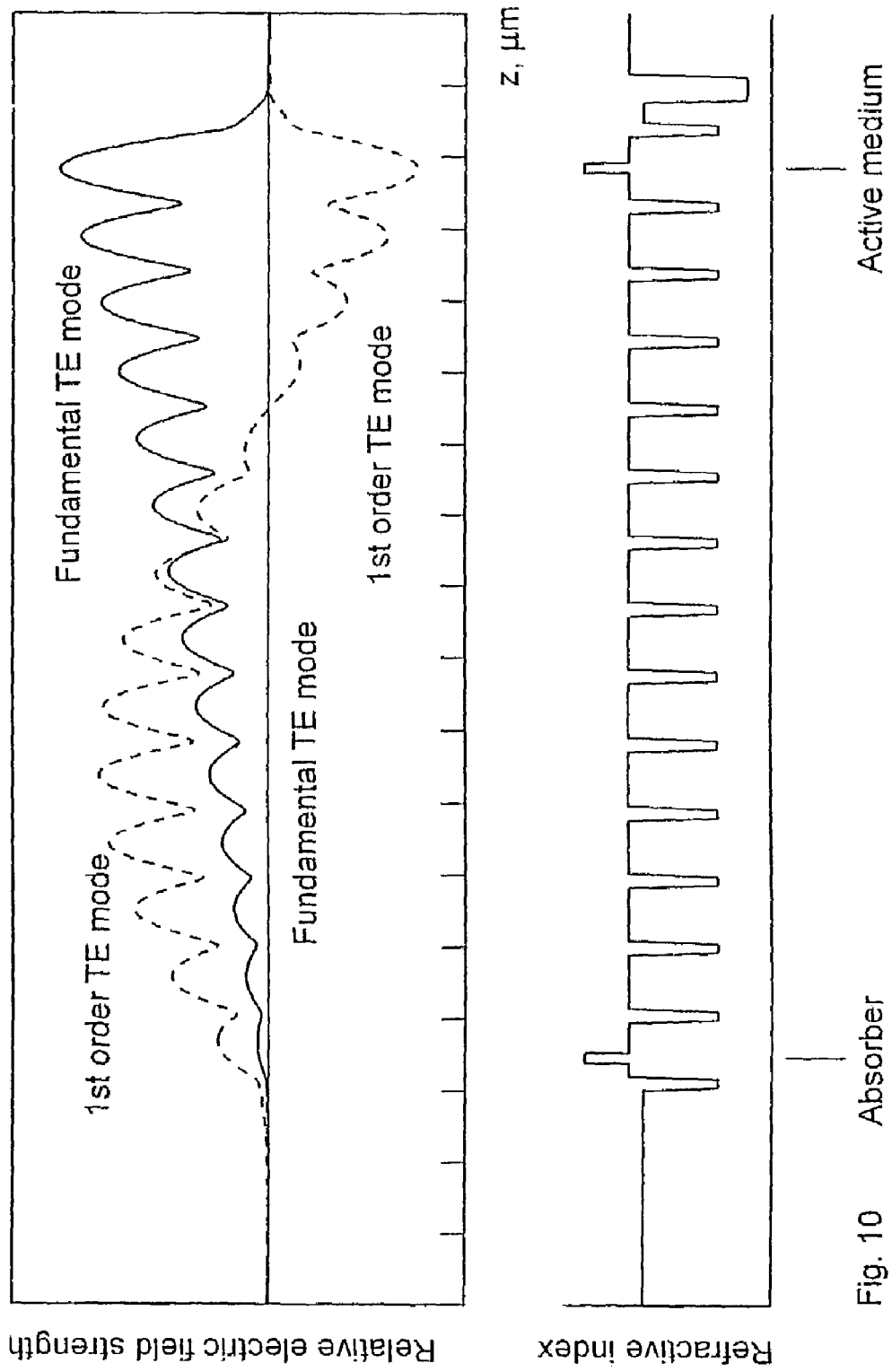
FIG. 10 shows a refractive index profile and the electric field strength of the fundamental TE mode and the first-order TE, where the electric field of the fundamental mode at the absorber is significantly suppressed as compared to the electric field of the first-order mode in an example of the embodiment shown in FIG. 9.

FIG. 10 shows the fundamental TE mode and the first-order TE modes of the laser (900) in the embodiment of FIG. 9. The calculated confinement factor for the fundamental mode exceeds that of the first-order mode by a factor of 1.5. However, due to a rapid decay of the localized fundamental mode into the depth of the photonic band gap crystal (920), its absorption at the absorber is about 20 times lower than the absorption of the first-order TE mode.

Figure 11:
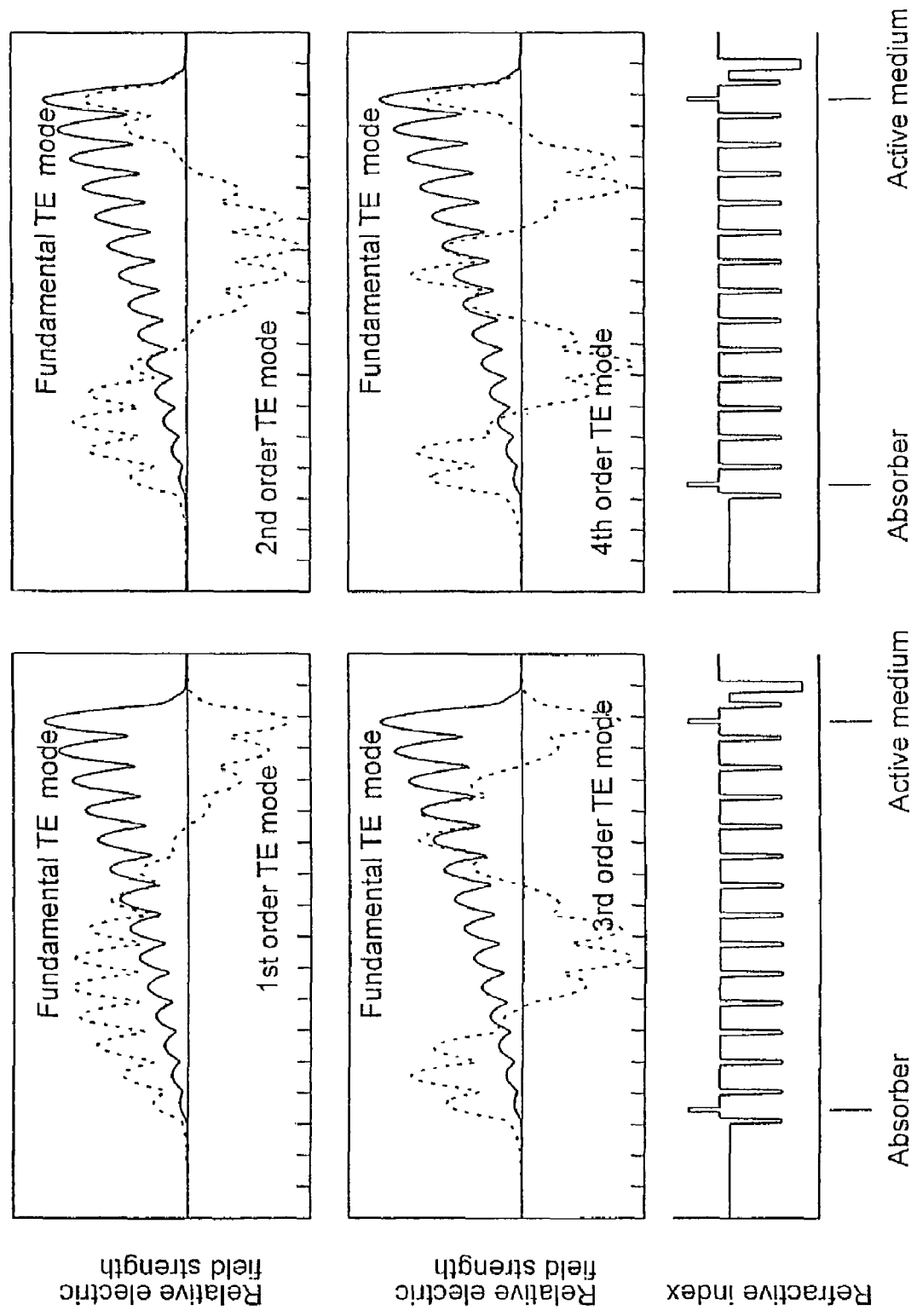
FIG. 11 shows a refractive index profile and the comparison of the electric field strength of the fundamental mode with the electric field strength of the first-order, second-order, third-order, and fourth-order TE modes in an example of the embodiment shown in FIG. 9.

FIG. 11 compares the fundamental TE mode with the first-order, the second-order, the third-order, and the fourth-order TE modes for the laser (900) in the embodiment of FIG. 9. FIG. 11 demonstrates large amplitudes of all high-order TE modes at the absorber. The "high-order" modes are all of the modes except for the fundamental mode. This demonstrates significant suppression of the fundamental mode at the absorber layer (701) compared with the other modes. The absorption coefficient of each of the high-order modes exceeds that of the fundamental mode by a factor of 20 (for the first-order mode) and by a factor of 100 and more for the other modes. This proves efficient separation of the fundamental mode from the high-order modes.

The overall thickness of the n-doped region, comprising the layers (103), (801), (104), and (801), n periods of the photonic band gap crystal (920), and the layer (106) in laser (900), is approximately 12 μm. The thickness of the p-doped region, comprising the layers (110), (801), (111), (801), (112), (801), (113), (801), and (114), is approximate 1 μm. In laser (900), the cladding layers are the leftmost layer (104) having a low refractive index and the layer (113) having a low refractive index, and the width of the waveguide is preferably equal to 13.16 μm. When discussing the confinement factor of the fundamental mode of the laser shown in FIG. 9, it is convenient to compare it with the confinement factor for a reference laser. For the reference laser, we take a double heterostructure laser having a GaAs 0.8 μm-wide waveguide and Ga$_{0.7}$Al$_{0.3}$As cladding layers. Thus the confinement factor of the fundamental mode of the laser shown in FIG. 9 is about 0.1 of the confinement factor for the reference laser. The confinement factor of the laser of the present invention can be doubled without affecting the profile of the modes by using a double quantum well as an active region (108). This makes it possible to achieve lasing with a reasonably low threshold current density.

Figure 12:
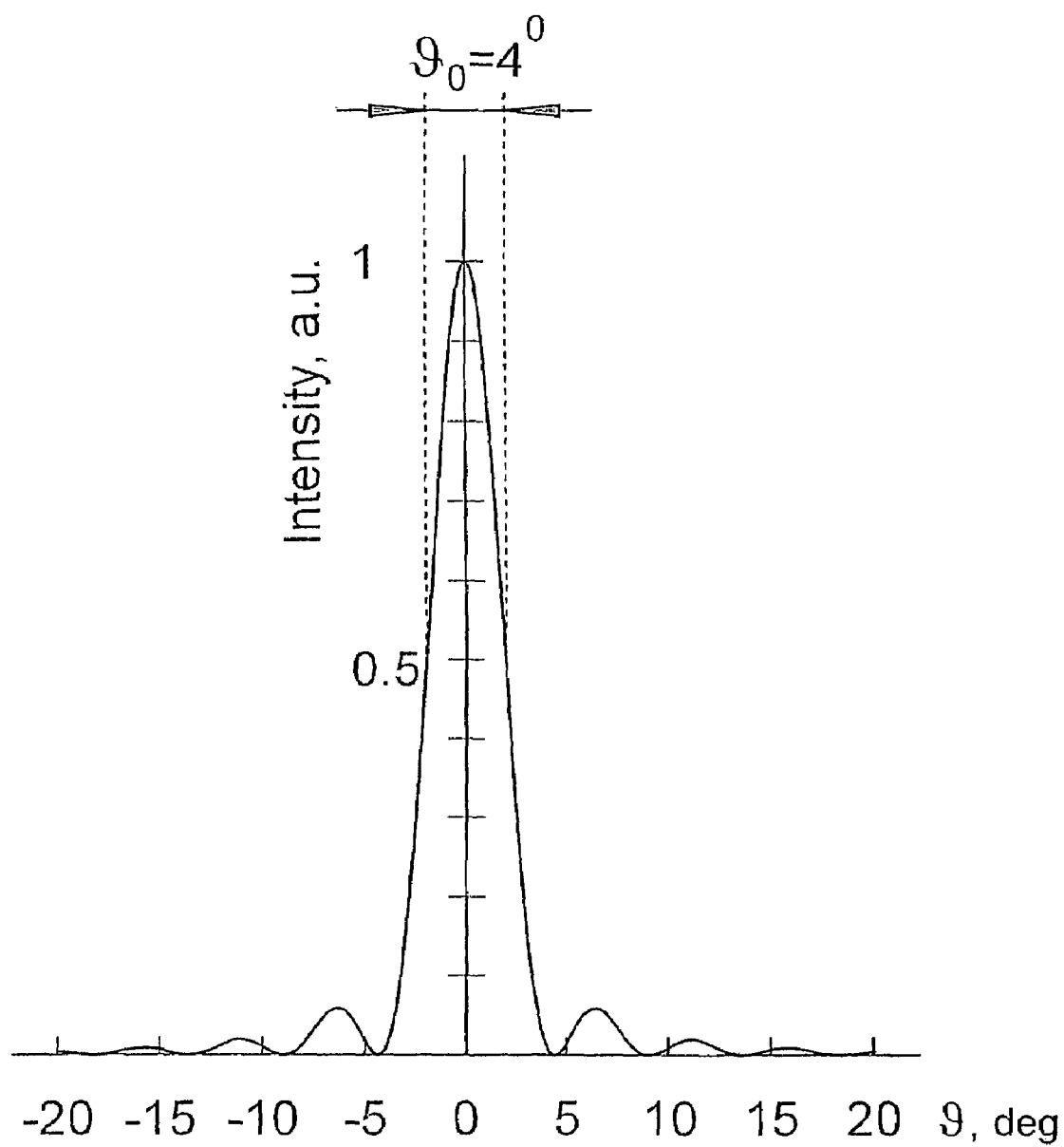
FIG. 12 shows a far-field pattern of the laser in an example of the embodiment shown in FIG. 9.

FIG. 12 shows a far-field diagram of the fundamental TE mode of this embodiment. The full width at half maximum of the far-field diagram equals 4°. Thus, the calculations performed for a sample laser structure allow the fabrication of a laser that is effectively a single-mode one, has a narrow (4°) beam divergence and a reasonable confinement factor of the fundamental TE mode.

Figure 13:
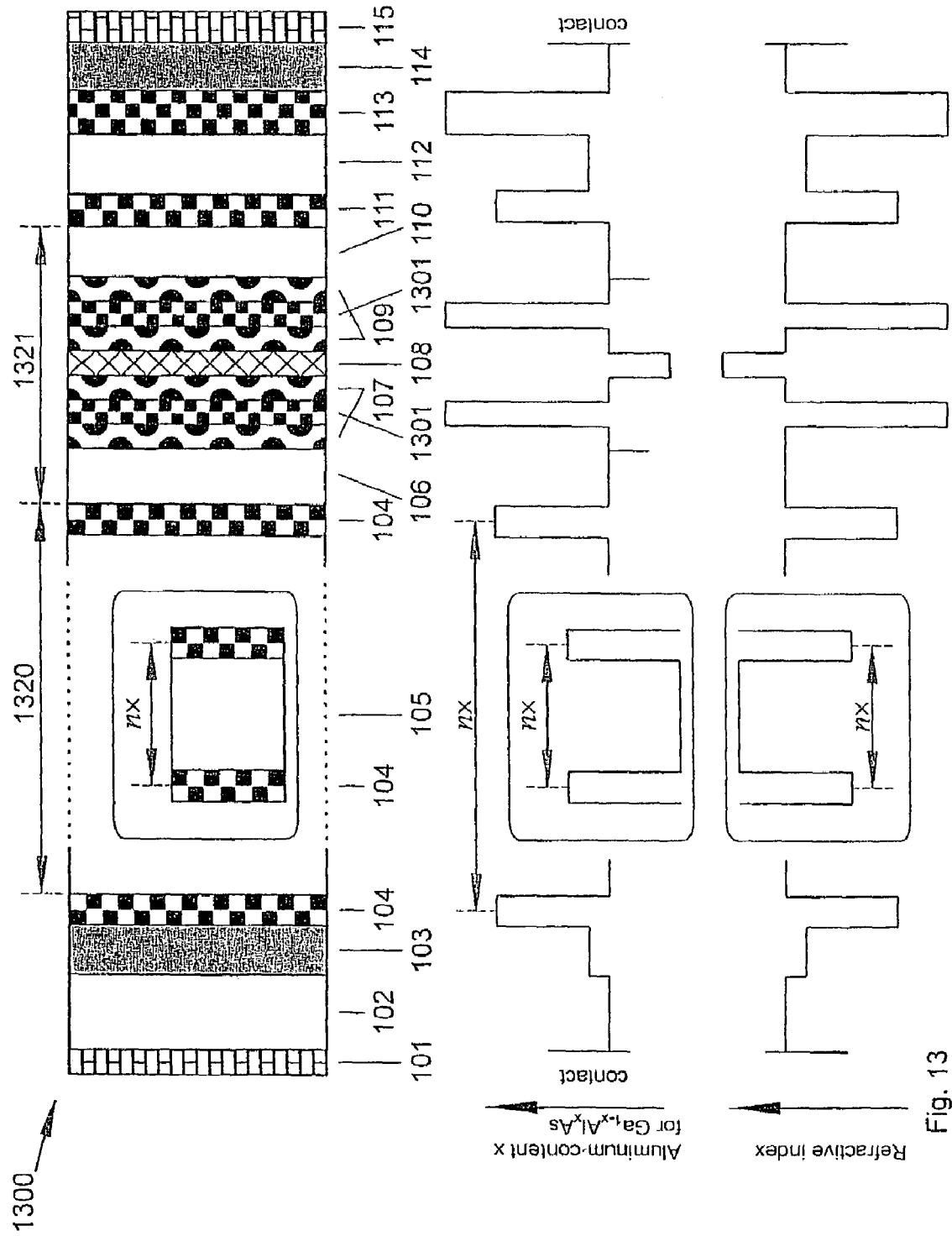
FIG. 13 shows a schematic diagram of another embodiment of the present invention in which the active region is surrounded by thin barriers.

FIG. 13 shows another embodiment of the present invention, where the laser (1300) is similar to the laser shown in FIG. 1, with an addition of two layers (1301). These thin layers (1301) surround the active region (108). These layers (1301) are formed from a material creating potential barriers for carriers. These layers (1301) prevent evaporation of carriers from the active region and thus provide high temperature stability of the laser (1300). These layers (1301) must be, one-the one hand, thin enough to promote the tunneling of the electrons from the n-doped layer (106) to the active region (108) and tunneling of the holes from the p-doped layer (110) to the active region (108). On the other hand, these layers (1301) must be sufficient to hinder evaporation of carriers from the active region (108) at elevated temperatures and thus to improve the thermal stability of the laser (1300). In an example, these layers (1301) are preferably formed from a $Ga_{1-x}Al_xAs$ alloy with a high aluminum content x. The thickness and the aluminum content in the layers (1301) are optimized to allow efficient tunneling of carriers to the active region (108) without increasing the resistance of the laser structure too much while hindering the evaporation of carriers from the active region (108). A typical thickness of the layer (1301) is less than 5 nm, and a typical aluminum content exceeds 0.4.

Figure 14:
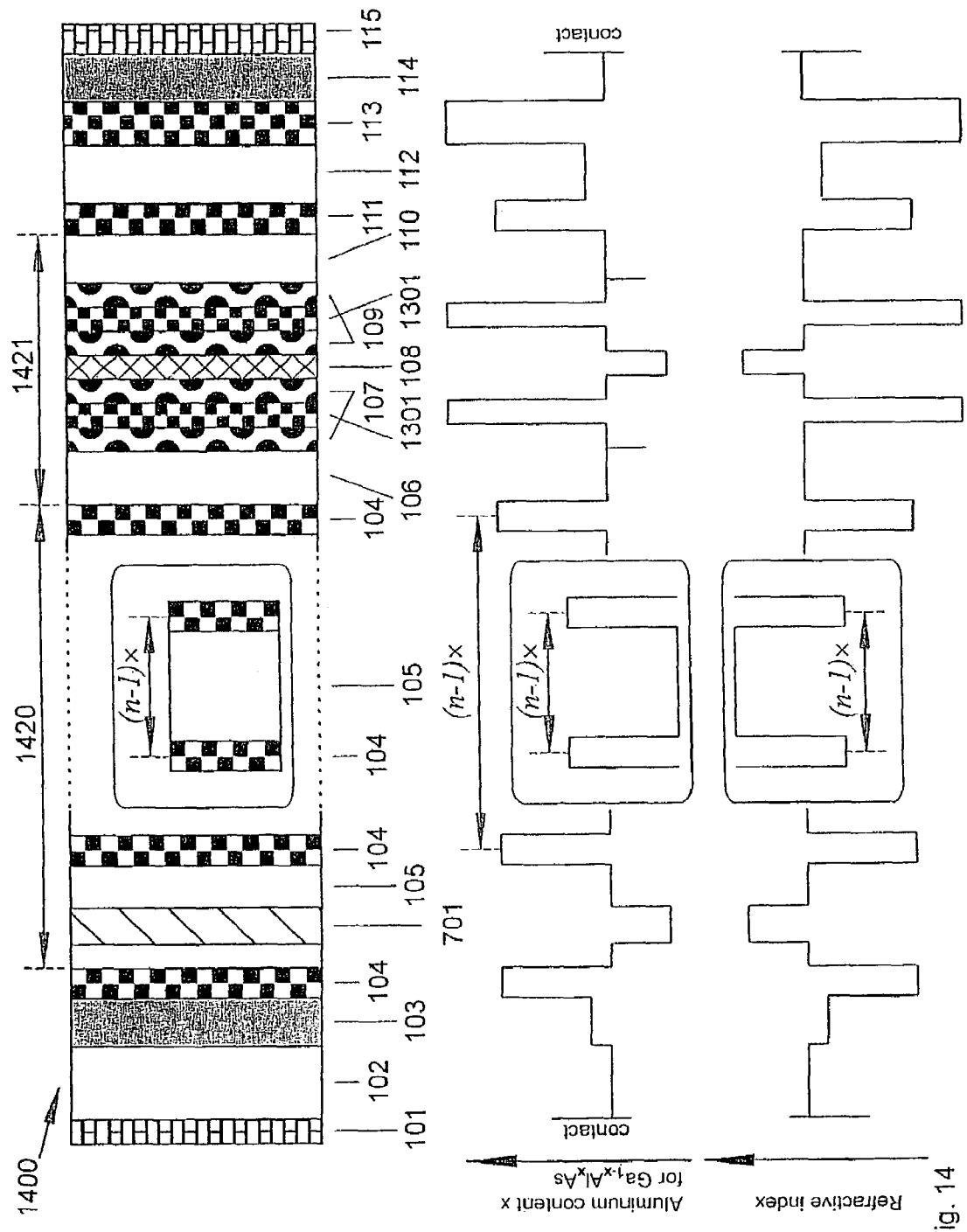
FIG. 14 shows a schematic diagram of another embodiment of the present invention in which an absorber layer is placed in one of the layers of the photonic band gap crystal, and the active region is surrounded by thin barriers.

FIG. 14 shows another embodiment of the present invention, where the laser (1400) is similar to the laser (700) shown in FIG. 7, with an additional two layers (1301) hindering evaporation of carriers from the active region (108). The photonic band gap crystal (1420) and a defect (1421) are also included in the laser (1400). The absorber layer (701) effectively suppresses extended modes. Surrounding the active region (108) with the thin barriers (1301) prevents evaporation of carriers from the active region and thus provides high temperature stability of the laser (1400).

Figure 15:
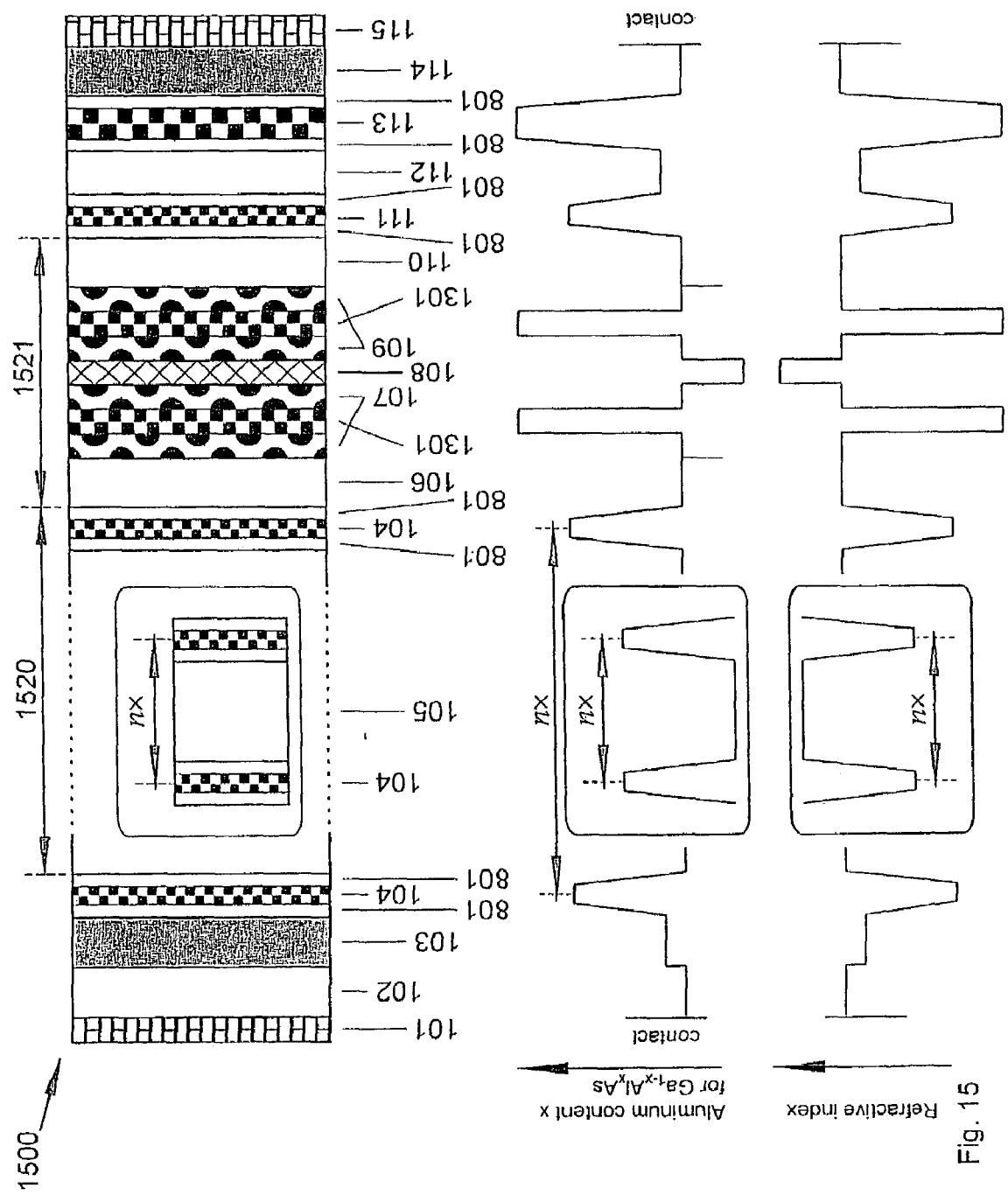
FIG. 15 shows a schematic diagram of another embodiment of the present invention in which layers with a high refractive index and layers with a low refractive index are separated by graded-index layers, and the active region is surrounded by thin barriers.

FIG. 15 shows another embodiment of the present invention, where the laser (1500) is similar to the laser (800) of FIG. 8, with an additional two layers (1301) hindering evaporation of carriers from the active region (108). The photonic band gap crystal (1520) and a defect (1521) are also included in the laser (1500). Graded index layers (801) provide continuous variation of the refractive index. The thin barriers (1301) surrounding the active region (108) prevent evaporation of carriers from the active region (108) and thus provide high temperature stability of the laser.

Figure 16:
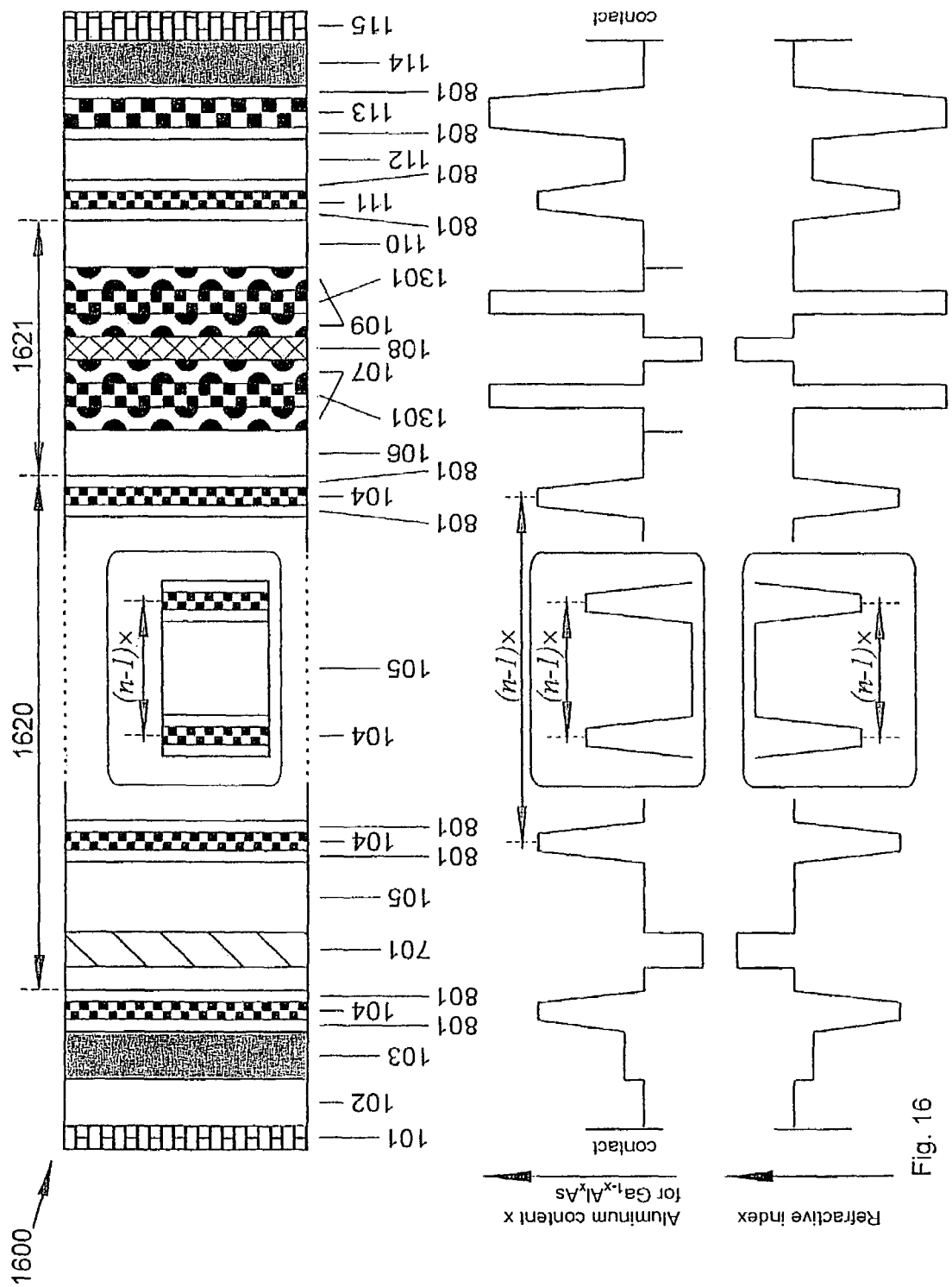
FIG. 16 shows a schematic diagram of another embodiment of the present invention which includes an absorber layer placed in one of the layers of the photonic band gap crystal, graded-index layers separating layers with a high refractive index and layers with a low refractive index, and thin barriers surrounding the active region.

FIG. 16 shows another embodiment of the present invention, where the laser (1600) is similar to the laser (900) shown in FIG. 9, with the addition of two layers (1301) hindering evaporation of carriers from the active region (108). The photonic band gap crystal (1620) and a defect (1621) are also included in the laser (1600). An absorber layer (701) effectively suppresses extended modes. Graded index layers (801) provide continuous variation of the refractive index. The thin barriers (1301) surrounding the active region (108) prevent evaporation of carriers from the active region (108) and thus provide high temperature stability of the laser.

FIG. 17 shows another embodiment of the present invention (the laser (1700)), where the active region is located in one of the layers of the photonic band gap crystal (1720), and the defect (1721) has only passive elements. In the particular embodiment of FIG. 17, an n-doped layer (1706), a weakly n-doped or an undoped layer (1707), the active region (1708), a weakly p-doped or an undoped layer (1709), and a p-doped layer (1710) are located in the rightmost period of the photonic band gap crystal (1720). The layers (1706), (1707), (1708), (1709), and (1710) are formed preferably from the same materials as the layers (106), (107), (108), (109), and (110) in the other embodiments of the present invention. The layer (1704) is a p-doped layer having a low refractive index. It should be formed from a material lattice-matched or nearly lattice-matched to the substrate (102), be transparent to the emitted light, and p-doped. In the preferred embodiment, the layer (1704) is made from the same material as the layers (104), but is p-doped. The defect (1721) shown in FIG. 17 includes a single p-doped layer (1722) having a high refractive index. The effect of the localization of the fundamental mode of laser radiation is realized in the same way, as described in the embodiment of FIG. 2. The defect (1721) has the same refractive index as the other layers (105) having a high refractive index, but is thicker than the layers (105).

Alternative embodiments of the present invention are similar to the FIGS. discussed above, but the active layer is located outside the defect. For example, the defect can be realized by a single layer having a refractive index higher than the layers (105) of the photonic band gap crystal, similar to the embodiment of FIG. 3. Alternatively, the defect may include two layers with a high refractive index sandwiching a layer with a low refractive index, where the layer with a low refractive index is thinner than the layers (104) of the photonic band gap crystal, similar to the embodiment of FIG. 4. Yet another embodiment defines the defect by two layers with a high refractive index sandwiching a layer with a refractive index intermediate between the refractive index of the layers (104) and (105) of the photonic band gap crystal, similar to the embodiment of FIG. 5.

Other embodiments of the present invention include structures where the active layer is located outside the localizing defect, and a localizing defect itself is realized by combining some or all of the variations shown in FIG. 2 through FIG. 5. In additional embodiments, a localizing defect is distributed over more than one period of the photonic band gap crystal. Still more embodiments localize the fundamental TE-mode by some aperiodic modulation of the refractive index. Other embodiments of the present invention include structures where photonic band gap crystals extend on both sides of the localizing defect.

Another embodiment includes structures where absorber layers are introduced similar to the embodiment of FIG. 7, but the active layer is located outside the localizing defect. An additional embodiment includes structures where the active layer is located outside the localizing defect and graded index layers are introduced between each layer with a low refractive index and a neighboring layer having a high refractive index, similar to the embodiment of FIG. 8. Yet another embodiment where the active layer is located outside the localizing defect includes thin tunnel barriers for carriers which surround the active layer, similar to the embodiment of FIG. 13. Other embodiments of the present invention are possible where the active layer is located outside the localizing defect, and some or all elements like absorber layers, graded-index layers, and thin tunnel barriers for carriers surrounding the active layers are included. Other embodiments of the present invention include structures where the defect is located either on the n-side or on the p-side from the active element.

In alternative embodiments of the present invention, only a part of the laser structure is formed from a photonic band gap crystal and the photonic band gap crystal provides efficient filtration of the higher modes of laser radiation. Additional embodiments where the active medium and the photonic band gap crystal are spatially separated and are placed in different parts of the laser structure are also encompassed by the present invention. In other embodiments of the present invention, a photonic band gap crystal is mounted on a facet of an edge-emitting laser thus promoting effective filtration of the higher modes of the laser radiation and providing effective single-mode lasing.

An additional embodiment of the present invention is a waveguide, e.g., an optical fiber in which the refractive index is modulated in the directions perpendicular to the direction of the propagation of light such that one and only one mode of propagating light is localized in the defect region with a high refractive index and decays in the cross-section plane away from the defect region, while all other modes are extended over the entire cross-section of the waveguide. This allows the application of absorbers or scatterers that hinder the propagation of all the modes except one and do not alter the propagation of the single mode of light. This embodiment realizes an effectively single-mode waveguide, e.g., a single mode optical fiber even in case of a thick fiber.

Additional embodiments of the present invention include a photonic band gap crystal with a refractive index modulation perpendicular to the propagation of light, as in all the embodiments of the present invention, but light propagates perpendicular to the plane of the p-n junction. This embodiment is preferably a vertical cavity surface emitting laser (VCSEL).

Figure 18:
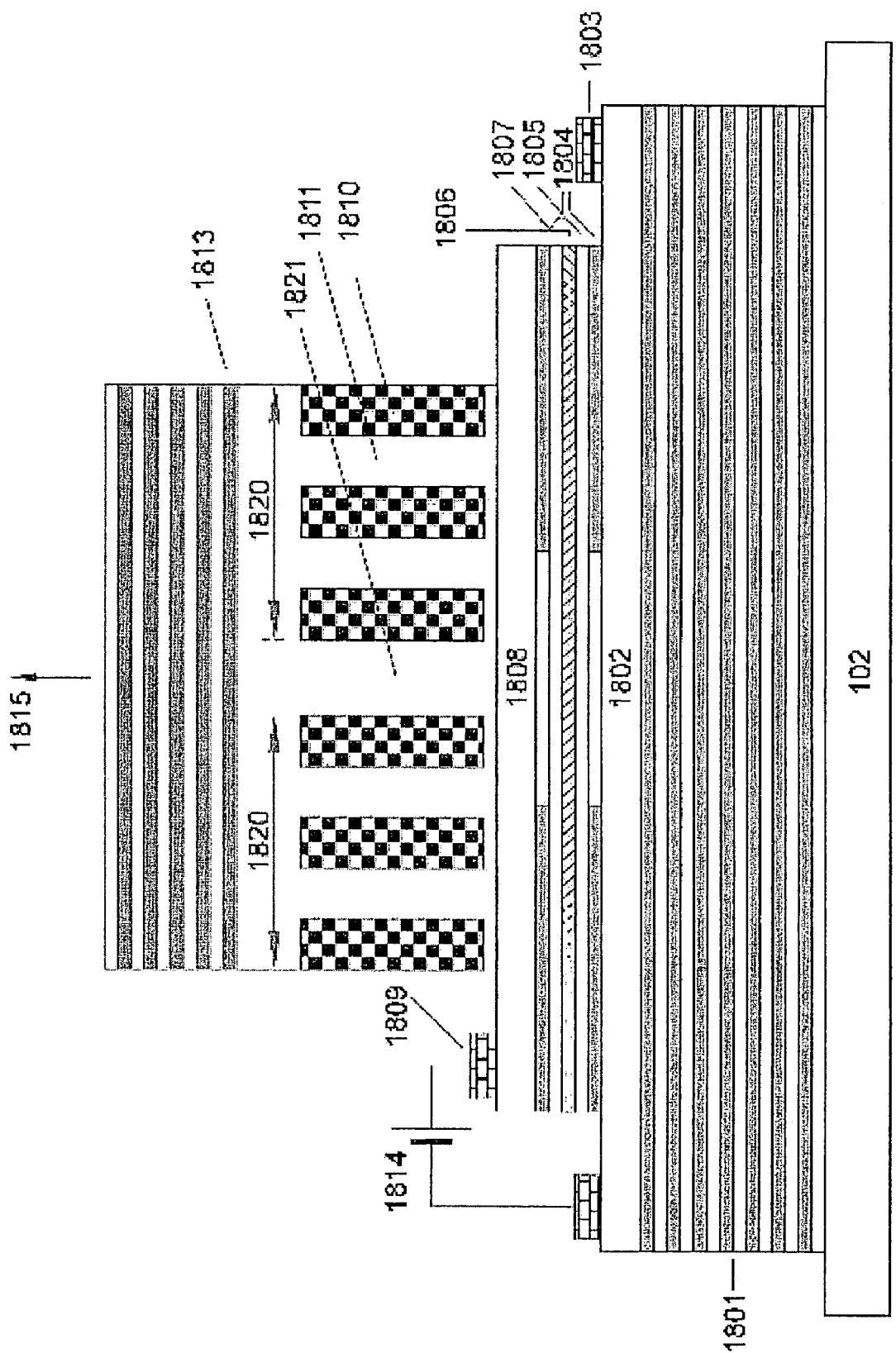
FIG. 18 shows a schematic diagram of another embodiment of the present invention where a photonic band gap crystal having a refractive index modulation in the lateral plane is introduced into a vertical cavity surface emitting laser.

Referring specifically to FIG. 18, an example of a VCSEL (1800) is shown using a photonic band gap crystal (1820) in accordance with the present invention. FIG. 18 shows a specific realization of a photonic band gap crystal with a refractive index modulation perpendicular to the direction of light propagation. The structure is grown epitaxially on the substrate (102). The substrate (102) is preferably formed from any III–V semiconductor material or III–V semiconductor alloy, e.g. GaAs, InP, GaSb, or others, as in the other embodiments of the present invention. In a preferred embodiment, GaAs is used. Bragg reflectors are preferably used for the bottom mirror (1801). The rest of the VCSEL (1800) includes two primary elements: 1) an active element above the bottom mirror (1801) and 2) a region above the active region including the photonic band gap crystal (1820) and the defect (1821). The photonic band gap crystal (1820) includes the layer (1811) in which vertical columns (1810) having a different refractive index are inserted.

To form the active element (1806), a current aperture (1804) separates an n-doped current spreading layer (1802), with a first metal contact (1803), from the weakly doped layers (1805) and (1807) surrounding the active element (1806). A second current aperture (1804) separates the weakly doped layer (1807) from a p-doped current spreading layer (1808), with a second metal contact (1809). Each layer is separated from the neighboring layer by a current aperture (1804) that works as a current blocking layer and is preferably formed from an Al(Ga)O layer or a proton bombardment layer.

The active element (1806) is preferably formed by any insertion, the energy band gap of which is narrower than that of the substrate (102). Possible active elements include, but are not limited to, a single-layer or a multi-layer system of quantum wells, quantum wires, quantum dots, or their combination. In a case of the device on a GaAs-substrate, preferred materials for the active element include, but are not limited to, a system of insertions of InAs, $In_{1-x}Ga_xAs$, $In_xGa_{1-x-y}Al_yAs$, $In_xGa_{1-x}As_{1-y}N_y$ or similar materials.

The n-doped layer (1802) is preferably formed from a material lattice-matched or nearly lattice-matched to the substrate (102), transparent to the generated light, and doped by donor impurities. It is preferably made of the same material as the n-emitter (103) in the other embodiments. The p-doped layer (1808) is preferably formed from the material lattice-matched or nearly lattice-matched to the substrate, transparent to the generated light and doped by acceptor impurities. It is preferably made of the same material as the p-emitter (114) in the other embodiments. The n-contact (1803) is preferably formed from the same material as the n-contact (101) in the other embodiments. The p-contact (1809) is preferably formed from the same material as the p-contact (115) in the other embodiments.

The n-doped current spreading layer (1802) sits directly on top of the bottom mirror (1801). The layer (1811) is subject to a selective etching followed by a subsequent heteroepitaxial overgrowth forming vertical columns (1810) of another material. The region (1821) is a defect localizing the fundamental lateral mode of the laser radiation.

Distributed Bragg reflectors can also be used for a top mirror (1813) that is on top of the region including the photonic band gap crystal (1820) and the defect (1821). The active element (1806) operates under forward bias (1814) as is typical for VCSELs. The light comes out (1815) through the top mirror (1813).

Different designs for the bottom mirror (1801) and for the top mirror (1813) can be used, as described, e.g. in, *D. G. Deppe, Optoelectronic Properties of Semiconductors and Superlattices, Vol. 10, Vertical-Cavity Surface-Emitting Lasers: Technology and Applications*, edited by J Cheng and N. K. Dutta, Gordon and Breach Science Publishers, 2000, pp. 1–61. The preferred embodiment is a multi-layered dielectric GaAs/AlGaO mirror.

A particular design of the photonic band gap crystal comprises alternating columns (1810) and (1811) and the defect (1821) as well as current apertures (1804). This design should be optimized in such a way that only the fundamental lateral mode of the laser radiation localized by the defect (1821) has significantly larger overlap with the active region than all higher modes extended over the entire lateral plane. Such design promotes effective single-mode lasing. The particular embodiment is calculated by solving a three-dimensional problem of the light propagation in an inhomogeneous medium by using, e.g., a method developed in *R. D. Meade et al. Accurate theoretical analysis of photonic band-gap materials, Phys. Rev. B* 48:11, pp. 8434–8437 (1993).

In other embodiments of the VCSEL, the photonic band gap crystal is formed by selective etching without overgrowth, by dielectric or metallic coating of the surface, or other patterning techniques. Any type of patterning used in these embodiments must promote a localization of the fundamental lateral mode of the laser radiation at the defect and thus obtain a significant overlap integral of the active medium with one and only one mode. All these approaches enable effective single-mode lasing.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A semiconductor edge-emitting laser comprising:
   a) an n-doped region, at least a part of which comprises a photonic band gap crystal including a layered comprising at least one layer, wherein each layer is doped by an n-typed impurity, wherein the layered structure has a periodically modulated refractive index, wherein the periodically modulated refractive index is modulated in a direction perpendicular to a direction of light propagation;

b) a defect contiguous with said photonic band gap crystal, comprising:
   i) a light generating layer that emits light when exposed to an injection current when a forward bias is applied;
   ii) a first thin tunnel barrier layer for electrons, located on an n-side of the light generating layer, wherein said first thin tunnel barrier layer is formed from a material selected from the group consisting of a weakly-doped n-layer and an undoped layer;
   iii) a second thin tunnel barrier layer for holes, located on a p-side of the light generating layer, wherein said second thin tunnel barrier layer is formed from a material selected from the group consisting of a weakly-doped p-layer and an undoped layer;
   iv) two layers sandwiching the first thin tunnel barrier layer; and
   v) two layers sandwiching the second thin tunnel barrier layer; and
c) a p-doped layered structure, comprising at least one layer, wherein each layer is doped by a p-type impurity, and wherein said p-doped layered structure is located on a side of said defect opposite said n-doped region, wherein the p-doped layered structure has a variable refractive index that hinders an extension of a fundamental mode to at least one doped layer within the p-doped layered structure and to a p-contact;
wherein the fundamental mode of laser radiation is localized by the defect, while all other modes are extended over the photonic band gap crystal;
wherein a total thickness of said photonic band gap crystal and said defect provides a low beam divergence.

2. The semiconductor edge-emitting laser of claim 1, further comprising:
   d) an n-emitter contiguous with said photonic band gap crystal remote from said defect;
   e) a substrate contiguous with said n-emitter remote from said defect; and
   f) an n-contact contiguous with said substrate remote from said defect.

3. The semiconductor edge-emitting laser of claim 2, further comprising:
   g) a p-emitter contiguous with said p-doped layered structure remote from said defect; and
   h) the p-contact contiguous with said p-emitter remote from said defect.

4. The semiconductor edge-emitting laser of claim 1, wherein said defect further comprises:
   vi) a thick n-doped layer contiguous with the layer sandwiching the first thin tunnel barrier layer remote from said light generating layer; and
   vii) a thick p-doped layer contiguous with the layer sandwiching the second thin tunnel barrier layer remote from said light generating layer.

5. The semiconductor edge-emitting laser of claim 1 wherein both layers sandwiching the first thin tunnel barrier layer are formed from a material selected from the group consisting of a weakly-doped n-layer and an undoped layer.

6. The semiconductor edge-emitting laser of claim 1 wherein at least one of the layers sandwiching the first thin tunnel barrier are formed from a material selected from the group consisting of a weakly-doped n-layer and an undoped layer.

7. The semiconductor edge-emitting laser of claim 1 wherein both layers sandwiching the second thin tunnel barrier layer are formed from a material selected from the group consisting of a weakly-doped p-layer and an undoped layer.

8. The semiconductor edge-emitting laser of claim 1 wherein at least one of the layers sandwiching the second thin tunnel barrier are formed from a material selected from the group consisting of a weakly-doped p-layer and an undoped layer.

9. The semiconductor edge-emitting laser of claim 1 wherein the layered structure of the photonic band gap crystal comprises a periodic alternation of a first layer having a high refractive index and a second layer having a low refractive index.

10. The semiconductor edge-emitting laser of claim 9 wherein said defect further comprises a region contiguous with said light generating layer on both sides, wherein said region has a refractive index which is the same as the refractive index of the first layer of the photonic band gap crystal, and said region is thicker than each of said first layers of the photonic band gap crystal.

11. The semiconductor edge-emitting laser of claim 9 wherein said defect further comprises a region contiguous with said light generating layer on both sides, wherein said region has a same thickness as the first layer of the photonic band gap crystal and a refractive index higher than said first layer of the photonic band gap crystal and said second layer of the photonic band gap crystal.

12. The semiconductor edge-emitting laser of claim 9 wherein said defect further comprises the first layer of said photonic band gap crystal contiguous with said defect, a third layer with a low refractive index contiguous with said first layer remote from said photonic band gap crystal, and a fourth layer having a high refractive index contiguous with said third layer remote from said photonic band gap crystal, wherein said fourth layer is thinner than the second layers of the photonic band gap crystal.

13. The semiconductor edge-emitting laser of claim 9 wherein said defect further comprises the first layer of said photonic band gap crystal contiguous with said defect, a third layer with a refractive index intermediate between that of the first layer and the second layer of the photonic band gap crystal contiguous with said first layer remote from said photonic band gap crystal, and a fourth layer having a high refractive index contiguous with said third layer remote from said photonic band gap crystal.

14. The semiconductor edge-emitting laser of claim 9 where said defect extends over several periods of the photonic band gap crystal.

15. The semiconductor edge-emitting laser of claim 1 where the photonic band gap crystal is realized by an aperiodic modulation of the refractive index.

16. The semiconductor edge-emitting laser of claim 1, further comprising at least one absorbing layer that absorbs light and is located within one of the first layers of the photonic band gap crystal.

17. The semiconductor edge-emitting laser of claim 16, wherein there are a plurality of absorbing layers such that each absorbing layer is located within a different period of the photonic band gap crystal.

18. The semiconductor edge-emitting laser of claim 16 wherein the layered structure of the photonic band gap crystal comprises a periodic alternation of a first layer having a high refractive index and a second layer having a low refractive index.

19. The semiconductor edge-emitting laser of claim 16 wherein said defect further comprises a region contiguous with said light generating layer on both sides, wherein said region has a refractive index which is the same as the refractive index of the first layer of the photonic band gap crystal, and said region is thicker than each of said first layers of the photonic band gap crystal.

20. The semiconductor edge-emitting laser of claim 16 wherein said defect further comprises a region contiguous with said light generating layer on both sides, wherein said region has a same thickness as the first layer of the photonic band gap crystal and a refractive index higher than said first layer of the photonic band gap crystal and said second layer of the photonic band gap crystal.

21. The semiconductor edge-emitting laser of claim 16 wherein said defect further comprises the first layer of said photonic band gap crystal contiguous with said defect, a third layer with a low refractive index contiguous with said first layer remote from said photonic band gap crystal, and a fourth layer having a high refractive index contiguous with said third layer remote from said photonic band gap crystal, wherein said fourth layer is thinner than the second layers of the photonic band gap crystal.

22. The semiconductor edge-emitting laser of claim 16 wherein said defect further comprises the first layer of said photonic band gap crystal contiguous with said defect, a third layer with a refractive index intermediate between that of the first layer and the second layer of the photonic band gap crystal contiguous with said first layer remote from said photonic band gap crystal, and a fourth layer having a high refractive index contiguous with said third layer remote from said photonic band gap crystal.

23. The semiconductor edge-emitting laser of claim 16 wherein said defect is extended over several periods of the photonic band gap crystal.

24. The semiconductor edge-emitting laser of claim 16 wherein the photonic band gap crystal is realized by an aperiodic modulation of the refractive index.

25. The semiconductor edge-emitting laser of claim 1 wherein the layered structure of the photonic band gap crystal comprises a periodic alternation of a first layer having a high refractive index, a graded-index layer, a second layer having a low refractive index, and another graded-index layer.

26. The semiconductor edge-emitting laser of claim 25 where all heterojunctions in doped regions are realized by graded layers.

27. The semiconductor edge-emitting laser of claim 26 wherein said defect further comprises a region contiguous with said light generating layer on both sides, wherein said region has a refractive index which is the same as the refractive index of the first layer of the photonic band gap crystal, and said region is thicker than each of said first layers of the photonic band gap crystal.

28. The semiconductor edge-emitting laser of claim 26 wherein said defect further comprises a region contiguous with said light generating layer on both sides, wherein said region has a same thickness as the first layer of the photonic band gap crystal and a refractive index higher than said first layer of the photonic band gap crystal and said second layer of the photonic band gap crystal.

29. The semiconductor edge-emitting laser of claim 26 wherein said defect further comprises the first layer of said photonic band gap crystal contiguous with said defect, a third layer with a low refractive index contiguous with said first layer remote from said photonic band gap crystal, and a fourth layer having a high refractive index contiguous with said third layer remote from said photonic band gap crystal, wherein said fourth layer is thinner than the second layers of the photonic band gap crystal.

30. The semiconductor edge-emitting laser of claim 26 wherein said defect further comprises the first layer of said photonic band gap crystal contiguous with said defect, a third layer with a refractive index intermediate between that of the first layer and the second layer of the photonic band gap crystal contiguous with said first layer remote from said photonic band gap crystal, and a fourth layer having a high refractive index contiguous with said third layer remote from said photonic band gap crystal.

31. The semiconductor edge-emitting laser of claim 26 where said defect extends over several periods of the photonic band gap crystal.

32. The semiconductor edge-emitting laser of claim 26 where the photonic band gap crystal is realized by an aperiodic modulation of the refractive index.

33. The semiconductor edge-emitting laser of claim 16 wherein the layered structure of the photonic band gap crystal comprises a periodic alternation of a first layer having a high refractive index, a graded-index layer, a second layer having a low refractive index, and another graded-index layer.

34. The semiconductor edge-emitting laser of claim 33 where all heterojunctions in doped regions are realized by graded layers.

35. The semiconductor edge-emitting laser of claim 34 wherein said defect further comprises a region contiguous with said light generating layer on both sides, wherein said region has a refractive index which is the same as the refractive index of the first layer of the photonic band gap crystal, and said region is thicker than each of said first layers of the photonic band gap crystal.

36. The semiconductor edge-emitting laser of claim 34 wherein said defect further comprises a region contiguous with said light generating layer on both sides, wherein said region has a same thickness as the first layer of the photonic band gap crystal and a refractive index higher than said first layer of the photonic band gap crystal and said second layer of the photonic band gap crystal.

37. The semiconductor edge-emitting laser of claim 34 wherein said defect further comprises the first layer of said photonic band gap crystal contiguous with said defect, a third layer with a low refractive index contiguous with said first layer remote from said photonic band gap crystal, and a fourth layer having a high refractive index contiguous with said third layer remote from said photonic band gap crystal, wherein said fourth layer is thinner than the second layers of the photonic band gap crystal.

38. The semiconductor edge-emitting laser of claim 34 wherein said defect further comprises the first layer of said photonic band gap crystal contiguous with said defect, a third layer with a refractive index intermediate between that of the first layer and the second layer of the photonic band gap crystal contiguous with said first layer remote from said photonic band gap crystal, and a fourth layer having a high refractive index contiguous with said third layer remote from said photonic band gap crystal.

39. The semiconductor edge-emitting laser of claim 34 wherein said defect extends over several periods of the photonic band gap crystal.

40. The semiconductor edge-emitting laser of claim 34 wherein the photonic band gap crystal is realized by an aperiodic modulation of the refractive index.

* * * * *

UNITED STATES PATENT AND TRADEMARK OFFICE
CERTIFICATE OF CORRECTION

PATENT NO. : 6,996,148 B2  Page 1 of 1
DATED : February 7, 2006
INVENTOR(S) : Shchukin et al.

It is certified that error appears in the above-identified patent and that said Letters Patent is hereby corrected as shown below:

Column 14,
Line 61, after "layered" insert -- structure --.

Signed and Sealed this

Fourth Day of April, 2006

JON W. DUDAS
*Director of the United States Patent and Trademark Office*